United States Patent
Yeh

(10) Patent No.: US 9,471,421 B2
(45) Date of Patent: Oct. 18, 2016

(54) DATA ACCESSING METHOD, MEMORY STORAGE DEVICE AND MEMORY CONTROLLING CIRCUIT UNIT

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 168 days.

(21) Appl. No.: 14/514,395

(22) Filed: Oct. 15, 2014

(65) Prior Publication Data

US 2016/0062828 A1 Mar. 3, 2016

(30) Foreign Application Priority Data

Aug. 28, 2014 (TW) ............................. 103129680 A

(51) Int. Cl.
| | | |
|---|---|---|
| G11C 29/00 | (2006.01) | |
| G06F 11/10 | (2006.01) | |
| G06F 12/02 | (2006.01) | |
| H03M 13/11 | (2006.01) | |
| H03M 13/37 | (2006.01) | |
| H03M 13/00 | (2006.01) | |

(52) U.S. Cl.
CPC ......... G06F 11/1068 (2013.01); G06F 11/102 (2013.01); G06F 11/1044 (2013.01); G06F 12/0246 (2013.01); H03M 13/1102 (2013.01); H03M 13/3761 (2013.01); H03M 13/6516 (2013.01); G06F 2212/7201 (2013.01); H03M 13/6325 (2013.01)

(58) Field of Classification Search
CPC .............. G06F 11/1068; G06F 11/102; G06F 11/1044; G06F 12/0246; G06F 2212/7201; G06F 11/1072; H03M 13/6516; H03M 13/1102; H03M 13/3761; H03M 13/6325; G11C 7/1006; G11C 29/78; G11C 11/5642; G11C 16/0483; G11C 16/10; G11C 11/5628; G11C 2211/564
See application file for complete search history.

(56) References Cited

U.S. PATENT DOCUMENTS

| | | | | |
|---|---|---|---|---|
| 2011/0090734 A1* | 4/2011 | Burger, Jr. | .......... | G06F 11/1072 365/185.03 |
| 2013/0024605 A1* | 1/2013 | Sharon | ................ | G06F 11/1072 711/103 |
| 2014/0003152 A1* | 1/2014 | Sharon | ................ | G11C 11/5628 365/185.18 |
| 2014/0006898 A1 | 1/2014 | Sharon et al. | | |
| 2014/0115427 A1* | 4/2014 | Lu | ........................ | G06F 11/1048 714/773 |
| 2014/0245098 A1* | 8/2014 | Sharon | ................ | G06F 11/1012 714/755 |

FOREIGN PATENT DOCUMENTS

TW 201101317 1/2011

OTHER PUBLICATIONS

"Office Action of Taiwan Counterpart Application", issued on Apr. 15, 2016, p. 1-p. 5, in which the listed references were cited.

* cited by examiner

Primary Examiner — Guerrier Merant
(74) Attorney, Agent, or Firm — Jianq Chyun IP Office

(57) ABSTRACT

A data accessing method, a memory storage device and a memory controlling circuit unit are provided. The data accessing method includes: determining whether a first physical programming unit storing first data belongs to a first type physical programming unit or a second type physical programming unit; if the first physical programming unit belongs to the first type physical programming unit, generating a first verification code corresponding to the first data and a second verification code for being combined with the first verification code, and writing the first data and the first verification code into the first physical programming unit; and if the first data is decoded unsuccessfully by using the first verification code, combining the second verification code and the first verification code to decode the first data.

33 Claims, 15 Drawing Sheets

DATA ACCESSING METHOD, MEMORY STORAGE DEVICE AND MEMORY CONTROLLING CIRCUIT UNIT

CROSS-REFERENCE TO RELATED APPLICATION

This application claims the priority benefit of Taiwan application serial no. 103129680, filed on Aug. 28, 2014. The entirety of the above-mentioned patent application is hereby incorporated by reference herein and made a part of this specification.

BACKGROUND

1. Technical Field

The invention relates to a data accessing method, and more particularly, relates to a data accessing method, a memory storage device and a memory controlling circuit unit for a rewritable non-volatile memory module.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

Generally, in order to ensure data integrity, data is encoded before written into the rewritable non-volatile memory module. That is, only the encoded data are written into the rewritable non-volatile memory module. On the other hand, data read from the rewritable non-volatile memory module will go through a corresponding decoding procedure. The data protection capability of each rewritable non-volatile memory module is depended upon a strength of an error checking and correcting code generated during the encoding. However, the strength of the error checking and correcting code generated during the encoding cannot be adjusted according to characteristics of the flash memory.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a data access method, a memory storage device and a memory controlling circuit unit, and capable of improving a usage efficiency for the physical programming units with different reliabilities.

A data access method for a rewritable non-volatile memory module is provided according to an exemplary embodiment of the invention. The rewritable non-volatile memory module includes a plurality of physical erasing units. Each of the physical erasing units includes a plurality of physical programming units, and the data accessing method includes the following. Whether a first physical programming unit configured to store first data among the physical programming units belongs to a first type physical programming unit or a second type physical programming unit is determined. If the first physical programming unit belongs to the first type physical programming unit, a first verification code corresponding to the first data and a second verification code for being combined with the first verification code are generated, and the first data and the first verification code are written into the first physical programming unit. The second verification code and the first verification code are combined to decode the first data if the first data is decoded unsuccessfully by using the first verification code.

A memory controlling circuit unit configured to control a rewritable non-volatile memory module is provided according to an exemplary embodiment of the invention. The rewritable non-volatile memory module includes a plurality of physical erasing units. Each of the physical erasing units includes a plurality of physical programming units. The memory controlling circuit unit includes a host interface, a memory interface, a memory management circuit and an error checking and correcting circuit. The host interface is configured to couple to a host system. The memory interface is used for coupling to the rewritable non-volatile memory module. The memory management circuit is coupled to the host interface and the memory interface and configured to send a read command sequence in order to read data from the rewritable non-volatile memory module or send a write command sequence in order to write data into the rewritable non-volatile memory module. The error checking and correcting circuit is coupled to the memory management circuit. The memory management circuit is configured to determine whether a first physical programming unit configured to store first data among the physical programming units belongs to a first type physical programming unit or a second type physical programming unit. If the first physical programming unit belongs to the first type physical programming unit, the memory management circuit is further configured to instruct the error checking and correcting circuit to generate a first verification code corresponding to the first data and a second verification code for being combined with the first verification code, and the memory management circuit is further configured to send the write command sequence in order to write the first data and the first verification code into the first physical programming unit. The error checking and correcting circuit is configured to combine the second verification code and the first verification code to decode the first data if the first data is decoded unsuccessfully by using the first verification code.

A memory storage device includes a connection interface unit, a rewritable non-volatile memory module and a memory controlling circuit unit is provided according to an exemplary embodiment of the invention. The connection interface unit is configured to couple to a host system. The rewritable non-volatile memory module includes a plurality of physical erasing units, and each of the physical erasing units includes a plurality of physical programming units. The memory controlling circuit unit is coupled to the connection interface unit and the rewritable non-volatile memory module. The memory controlling circuit unit is configured to determine whether a first physical programming unit configured to store first data among the physical programming units belongs to a first type physical programming unit or a second type physical programming unit. If the first physical programming unit belongs to the first type physical programming unit, the memory controlling circuit unit is further configured to generate a first verification code corresponding to the first data and a second verification code for being combined with the first verification code, and write the first data and the first verification code into the first physical programming unit. The memory controlling circuit unit is further configured to combine the second verification code and the first verification code to decode the first data if the first data is decoded unsuccessfully by using the first verification code.

A memory storage device includes a connection interface unit, a rewritable non-volatile memory module and a memory controlling circuit unit is provided according to an exemplary embodiment of the invention. The connection interface unit is configured to couple to a host system. The rewritable non-volatile memory module includes a plurality of physical erasing units, and each of the physical erasing units includes a plurality of physical programming units. The memory controlling circuit unit is coupled to the connection interface unit and the rewritable non-volatile memory module. The memory controlling circuit unit is configured to determine whether a reliability of a first physical programming unit configured to store first data among the physical programming units belongs to a first type reliability or a second type reliability. If the reliability of the first physical programming unit belongs to the first type reliability, the memory controlling circuit unit is further configured to generate a first primary verification code corresponding to the first data. The first primary verification code has a first length. If the reliability of the first physical programming unit belongs to the second type reliability, the memory controlling circuit unit is further configured to generate a second primary verification code corresponding to the first data. The second primary verification code has a second length, and the first length is longer than the second length.

Based on above, according to whether the physical programming unit for storing the data belongs to the first type physical programming unit or the second type physical programming unit, the invention may choose to generate one verification code or multiple verification codes which may be combined for using, and to use the combined verification code to decode if the data is decoded unsuccessfully. As a result, the usage efficiency for the physical programming units with different reliabilities may be improved.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
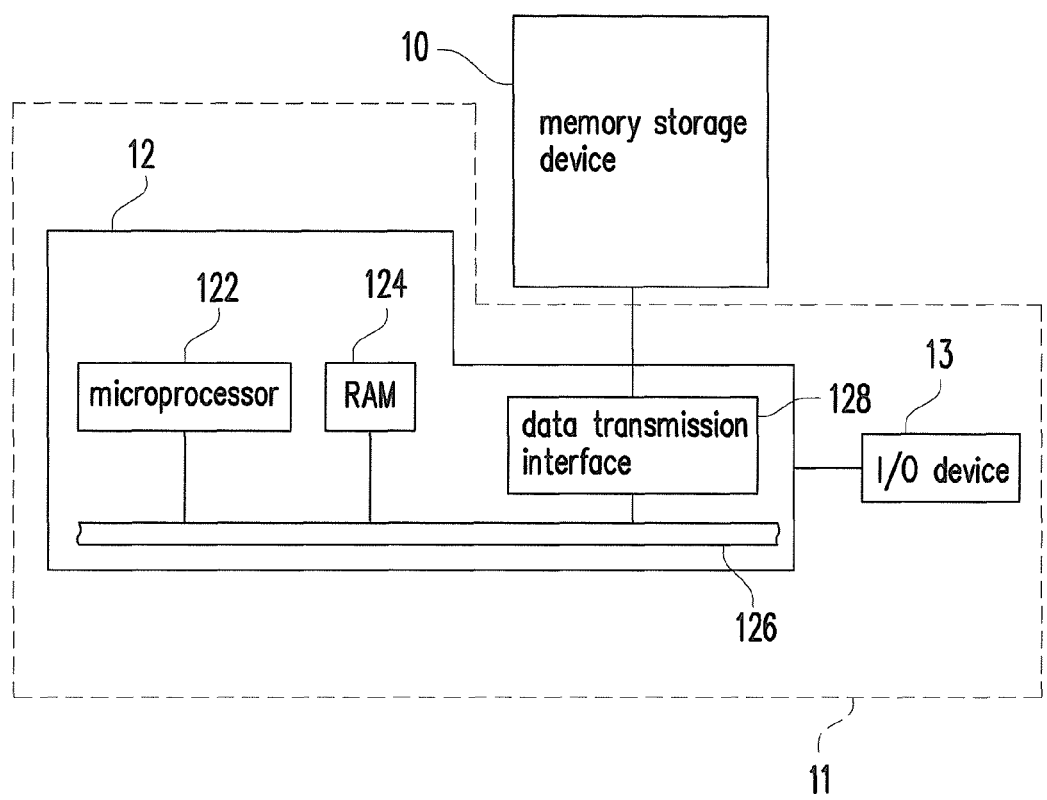
FIG. 1 is a schematic diagram illustrating a host system and a memory storage device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also known as a memory storage system) includes a rewritable non-volatile memory module and a controller (also known as a control circuit). The memory storage device is usually configured together with a host system so that the host system may write data to or read data from the memory storage device.

Figure 2:
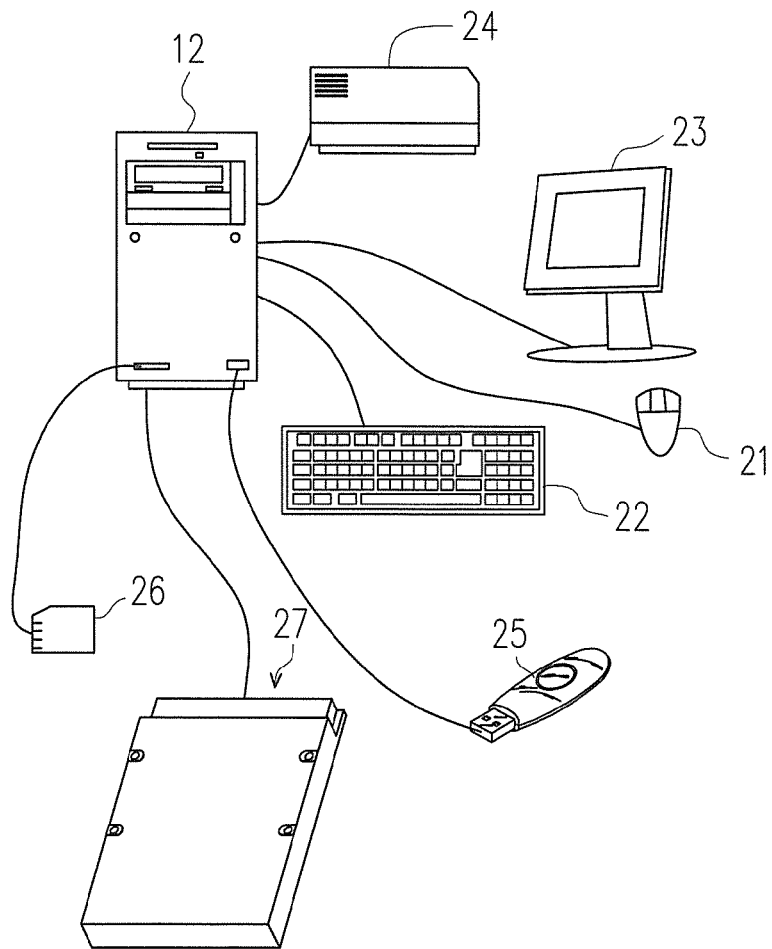
FIG. 2 is a schematic diagram of a computer, an input/output device, and a memory storage device according to an exemplary embodiment of the invention.

FIG. 1 is a schematic diagram illustrating a host system and a memory storage device according to an exemplary embodiment of the invention. FIG. 2 is a schematic diagram of a computer, an input/output device, and a memory storage device according to an exemplary embodiment of the invention.

Referring to FIG. 1, a host system 11 includes a computer 12 and an input/output (I/O) device 13. The computer 12 includes a microprocessor 122, a random access memory (RAM) 124, a system bus 126, and a data transmission interface 128. For example, the I/O device 13 includes a mouse 21, a keyboard 22, a display 23 and a printer 24 as shown in FIG. 2. It should be understood that the devices illustrated in FIG. 2 are not intended to limit the I/O device 13, and the I/O device 13 may further include other devices.

In an exemplary embodiment, the memory storage device 10 is coupled to other devices of the host system 11 through the data transmission interface 128. By using the microprocessor 122, the random access memory 124 and the Input/Output (I/O) device 13, data may be written into the memory storage device 10 or may be read from the memory storage device 10. For example, the memory storage device 10 may be a rewritable non-volatile memory storage device such as a flash drive 25, a memory card 26, or a solid state drive (SSD) 27 as shown in FIG. 2.

Figure 3:
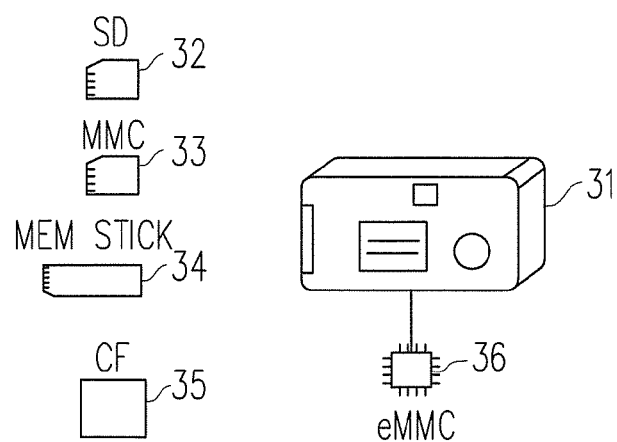
FIG. 3 is a schematic diagram illustrating a host system and a memory storage device according to an exemplary embodiment of the invention.

FIG. 3 is a schematic diagram illustrating a host system and a memory storage device according to an exemplary embodiment of the invention.

Generally, the host system 11 may be any system capable of substantially cooperating with the memory storage device 10 for storing data. Although the host system 11 is described by using a computer system in the present exemplary embodiment, in another exemplary embodiment, the host system 11 may be a digital camera, a video camera, a telecommunication device, an audio player, or a video player. For example, when the host system is a digital camera (video camera) 31, the rewritable non-volatile memory storage device may be a SD card 32, a MMC card 33, a memory stick 34, a CF card 35 or an embedded storage device 36 (as shown in FIG. 3). The embedded storage device 36 includes an embedded MMC (eMMC). It should be mentioned that the eMMC is directly coupled to a substrate of the host system.

Figure 4:
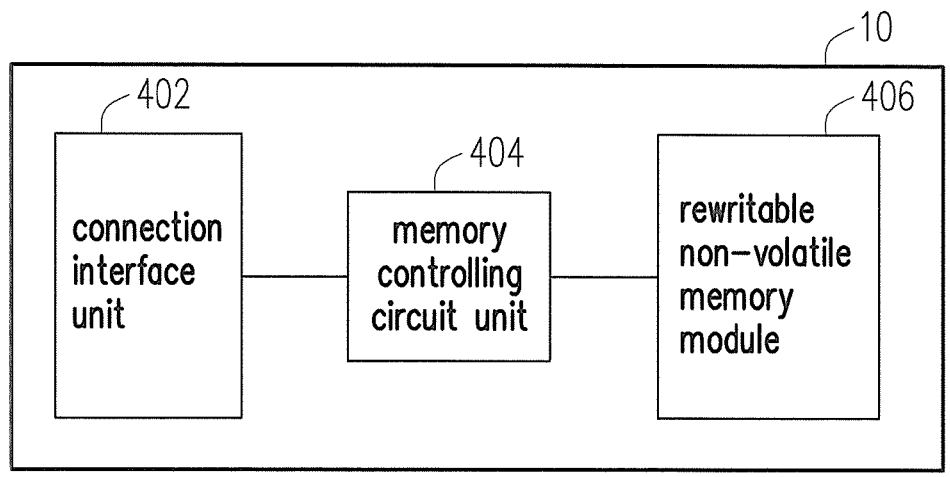
FIG. 4 is a schematic block diagram illustrating the memory storage device depicted in FIG. 1.

FIG. 4 is a schematic block diagram illustrating the memory storage device depicted in FIG. 1.

Referring to FIG. 4, the memory storage device 10 includes a connection interface unit 402, a memory controlling circuit unit 404 and a rewritable non-volatile memory module 406.

In the present exemplary embodiment, the connection interface unit 402 is compatible with a serial advanced technology attachment (SATA) standard. However, the invention is not limited thereto, and the connection interface unit 402 may also be compatible with a Parallel Advanced Technology Attachment (PATA) standard, an Institute of Electrical and Electronic Engineers (IEEE) 1394 standard, a peripheral component interconnect (PCI) Express interface standard, a universal serial bus (USB) standard, a secure digital (SD) interface standard, a Ultra High Speed-I (UHS-I) interface standard, a Ultra High Speed-II (UHS-II) interface standard, a memory sick (MS) interface standard, a multi media card (MMC) interface standard, an embedded MMC (eMMC) interface standard, a Universal Flash Storage (UFS) interface standard, a compact flash (CF) interface standard, an integrated device electronics (IDE) interface standard or other suitable standards. The connection interface unit 402 and the memory controlling circuit unit 404 may be packaged into one chip, or the connection interface unit 402 is distributed outside of a chip containing the memory controlling circuit unit 404.

The memory controlling circuit unit 404 is configured to execute a plurality of logic gates or control commands which are implemented in a hardware form or in a firmware form, so as to execute operations of writing, reading or erasing data in the rewritable non-volatile memory storage module 406 according to the commands of the host system 11.

The rewritable non-volatile memory module 406 is coupled to the memory controlling circuit unit 404 and configured to store data written from the host system 11. The rewritable non-volatile memory module 406 may be a Single Level Cell (SLC) NAND flash memory module, a Multi Level Cell (MLC) NAND flash memory module (i.e., a flash memory module capable of storing two bits of data in one memory cell), a Triple Level Cell (TLC) NAND flash memory module (i.e., a flash memory module capable of storing three bits of data in one memory cell), other flash memory modules or any memory module having the same features.

Figure 5:
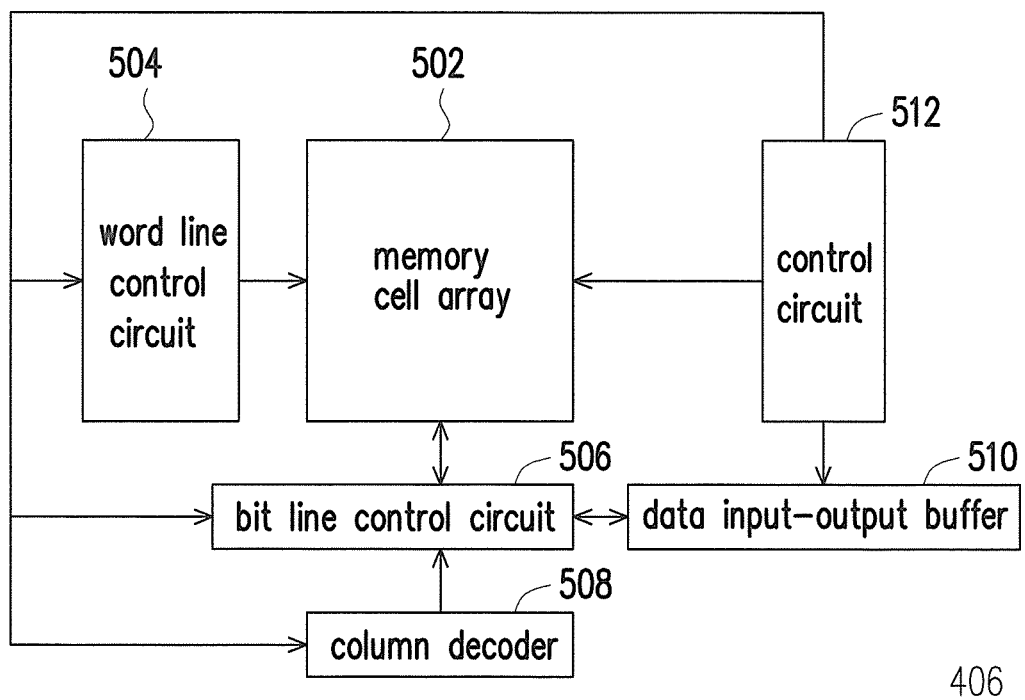
FIG. 5 is a schematic block diagram illustrating a rewritable non-volatile memory module according to an exemplary embodiment of the invention.
Figure 6:
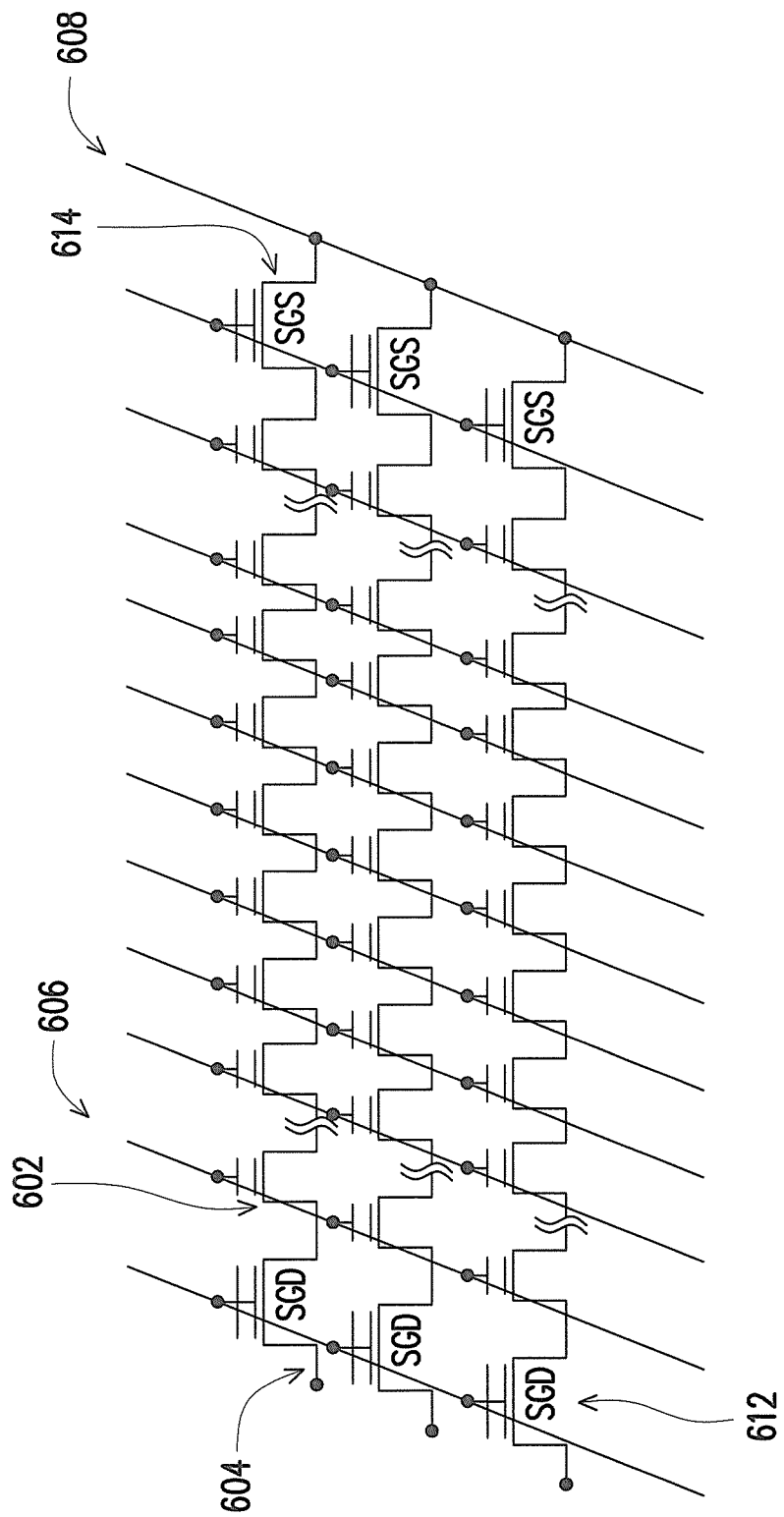
FIG. 6 is a schematic diagram illustrating a memory cell array according to an exemplary embodiment of the invention.

FIG. 5 is a schematic block diagram illustrating a rewritable non-volatile memory module according to an exemplary embodiment of the invention. FIG. 6 is a schematic diagram illustrating a memory cell array according to an exemplary embodiment of the invention.

Referring to FIG. 5, the rewritable non-volatile memory module 406 includes a memory cell array 502, a word line control circuit 504, a bit line control circuit 506, a column decoder 508, a data input-output buffer 510 and a control circuit 512.

In the present exemplary embodiment, the memory cell array 502 may include a plurality of memory cells 602 used to store data, a plurality of select gate drain (SGD) transistors 612, a plurality of select gate source (SGS) transistors 614, as well as a plurality of bit lines 604, a plurality of word lines 606, a common source line 608 connected to the memory cells (as shown in FIG. 6). The memory cell 602 is disposed at intersections of the bit lines 604 and the word lines 606 in a matrix manner (or in a 3D stacking manner). When a write command or a read command is received from the memory controlling circuit unit 404, the control circuit 512 controls the word line control circuit 504, the bit line control circuit 506, the column decoder 508, the data input-output buffer 510 to write the data into the memory cell array 502 or read the data from the memory cell array 502. Therein, the word line control circuit 504 is configured to control voltages applied to the word lines 606; the bit line control circuit 506 is configured to control voltages applied to the bit lines 604; the column decoder 508 is configured to select the corresponding bit line according to a row address in a command; and the data input-output buffer 510 is configured to temporarily store the data.

Each of the memory cells in the rewritable non-volatile memory module 406 may store one or more bits by changing a threshold voltage of the memory cell. More specifically, in each of the memory cells, a charge trapping layer is provided between a control gate and a channel. Amount of electrons in the charge trapping layer may be changed by applying a write voltage to the control gate thereby changing the threshold voltage of the memory cell. This procedure of changing the threshold voltage is also known as "writing data into the memory cell" or "programming the memory cell". Each of the memory cells in the memory cell array 502 has a plurality of storage statuses depended on changes in the threshold voltage. Moreover, which of the storage statuses is the memory cell belongs to may be determined by read voltages, so as to obtain the one or more bits stored in the memory cell.

Figure 7:
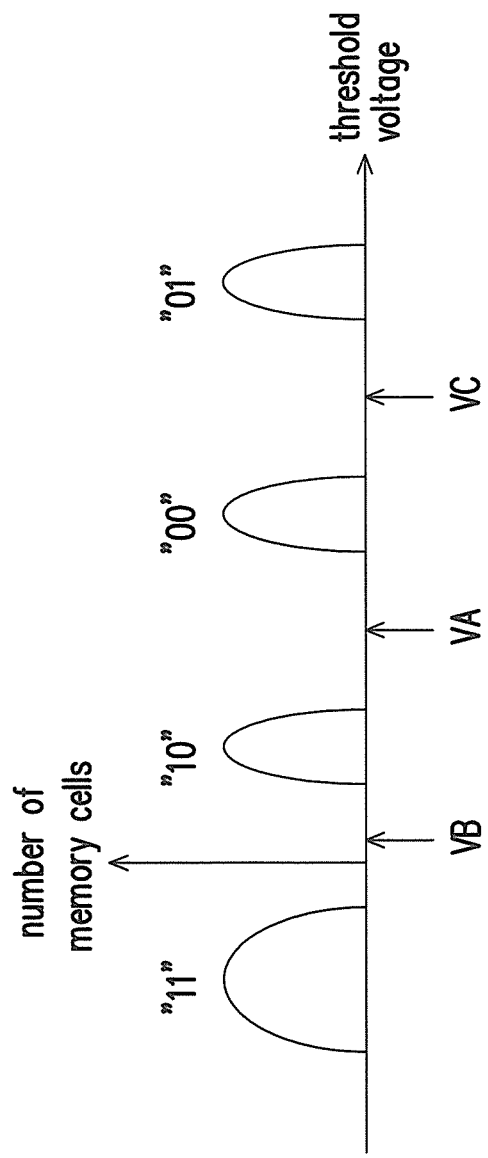
FIG. 7 is a histogram of a gate voltage corresponding to write data stored in the memory cell array according to an exemplary embodiment.

FIG. 7 is a histogram of a gate voltage corresponding to write data stored in the memory cell array according to an exemplary embodiment.

Referring to FIG. 7 that takes the MLC NAND flash memory for example, in which each of the memory cells has four storage statuses depended on different threshold voltages, and the statuses represent bits "11", "10", "00" and "01", respectively. In other words, each of the statuses includes a least significant bit (LSB) and a most significant bit (MSB). In the present exemplary embodiment, among the storage statuses (i.e., "11", "10", "00" and "01"), a first bit counted from the left is the LSB, and a second bit counted from the left is the MSB. Accordingly, in this exemplary embodiment, each of the memory cells may store two bits. It should be understood that, the storage statuses corresponding to the threshold voltage as illustrated in the FIG. 7 are merely an example. In another exemplary embodiment of the invention, the storage statuses corresponding to the threshold voltage may also have an arrangement of "11", "10", "01" and "00" that is arranged according to the threshold voltage from small to large or other arrangements. In addition, in another exemplary embodiment, it can also be defined that the first bit counted from the left is the MSB, and the second bit counted from the left is the LSB.

Figure 8:
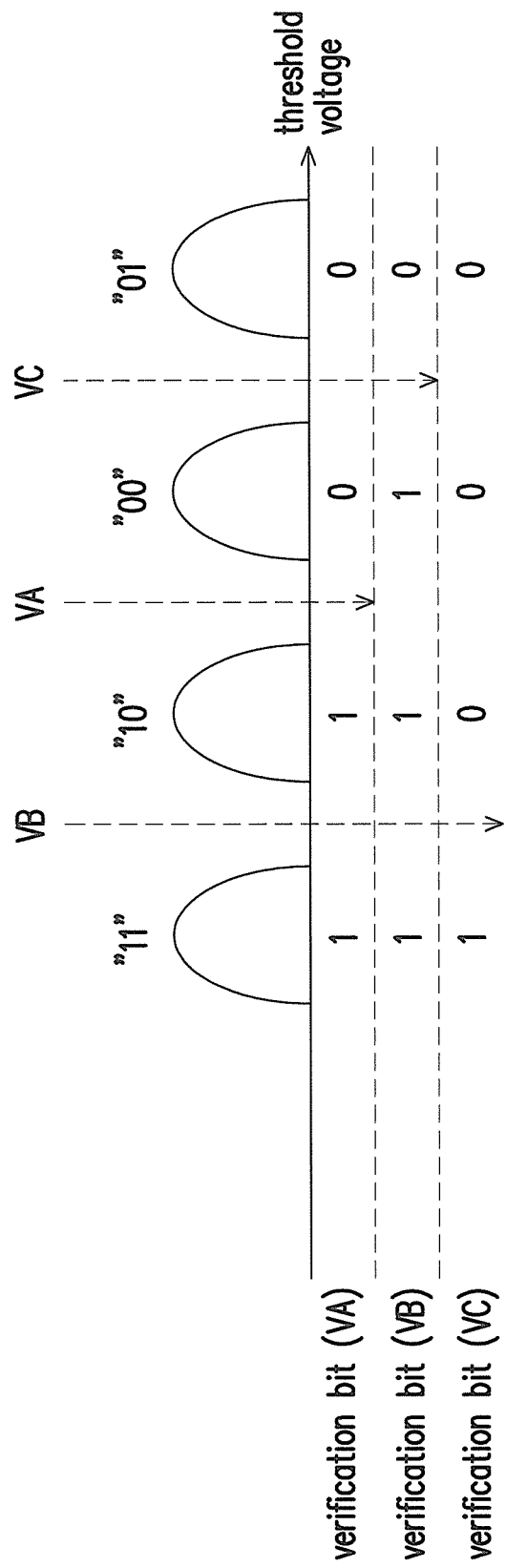
FIG. 8 illustrates a schematic diagram of reading data from a memory cell according to an exemplary embodiment.

FIG. 8 illustrates a schematic diagram of reading data from a memory cell according to an exemplary embodiment, which uses a MLC NAND flash memory for example.

Referring to FIG. 8, in a reading operation for the memory cells of the memory cell array 502, the read voltage is applied to the control gate, and data stored in the memory cells are identified according whether the channel of the memory cell is turned on. A verification bit (VA) is configured to indicate whether the channel of the memory cell is turned on when a read voltage VA is applied; a verification bit (VC) is configured to indicate whether the channel of the memory cell is turned on when a read voltage VC is applied; and a verification bit (VB) is configured to indicate whether the channel of the memory cell is turned on when a read voltage VB is applied. It is assumed herein that the corresponding channel of the memory cell being turned on is indicated by the verification bit being "1", and the corresponding channel of the memory cell not being turned on is indicated by the verification bit being "0". As shown in FIG. 8, which of the storage statuses the memory cell is in may be determined according to the verification bits (VA) to (VC), thereby obtaining the bits being stored.

Figure 9:
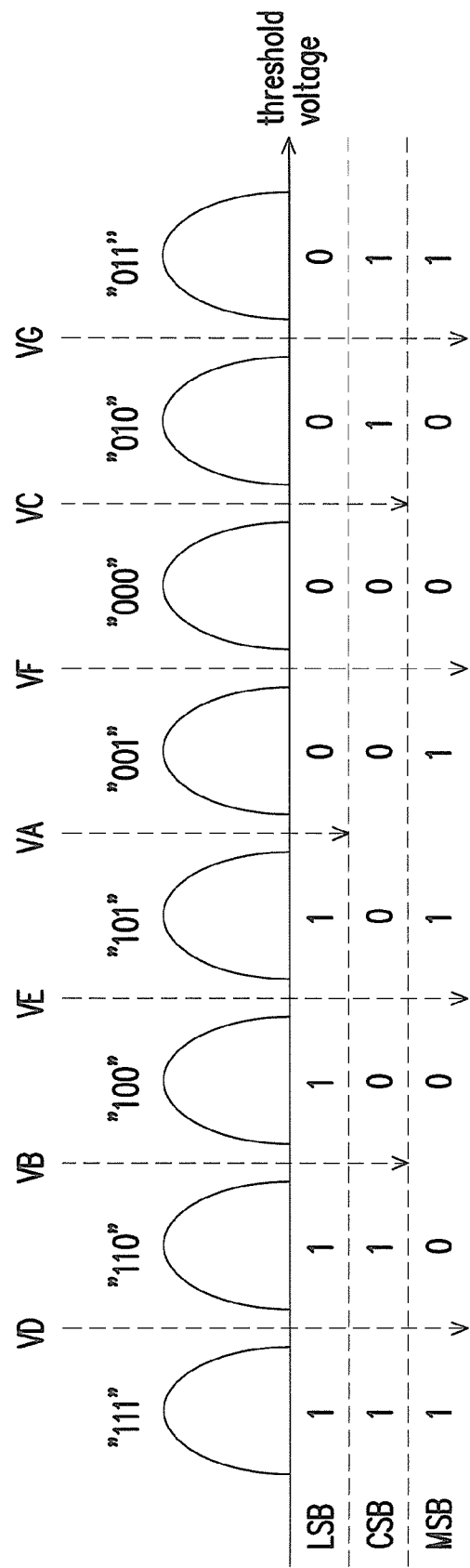
FIG. 9 illustrates a schematic diagram of reading data from a memory cell according to another exemplary embodiment.

FIG. 9 illustrates a schematic diagram of reading data from a memory cell according to another exemplary embodiment.

Referring to FIG. 9 which takes a TLC NAND flash memory for example, each of the storage statues includes a first bit counted from the left being the least significant bit (LSB), a second bit counted from the left being a center significant bit (CSB) and a third bit counted from the left being the most significant bit (MSB). In this embodiment, the memory cell includes eight storage statuses depended on different threshold voltages (i.e., "111", "110", "100", "101", "001", "000", "010" and "011"). The bits stored in the memory cell may be identified by applying the read voltages VA to VC to the control gate. Therein, it should be noted that, an arranging sequence of the eight storage statuses may be decided based on designs of manufacturers instead being limited by the arranging sequence of this embodiment.

Figure 10:
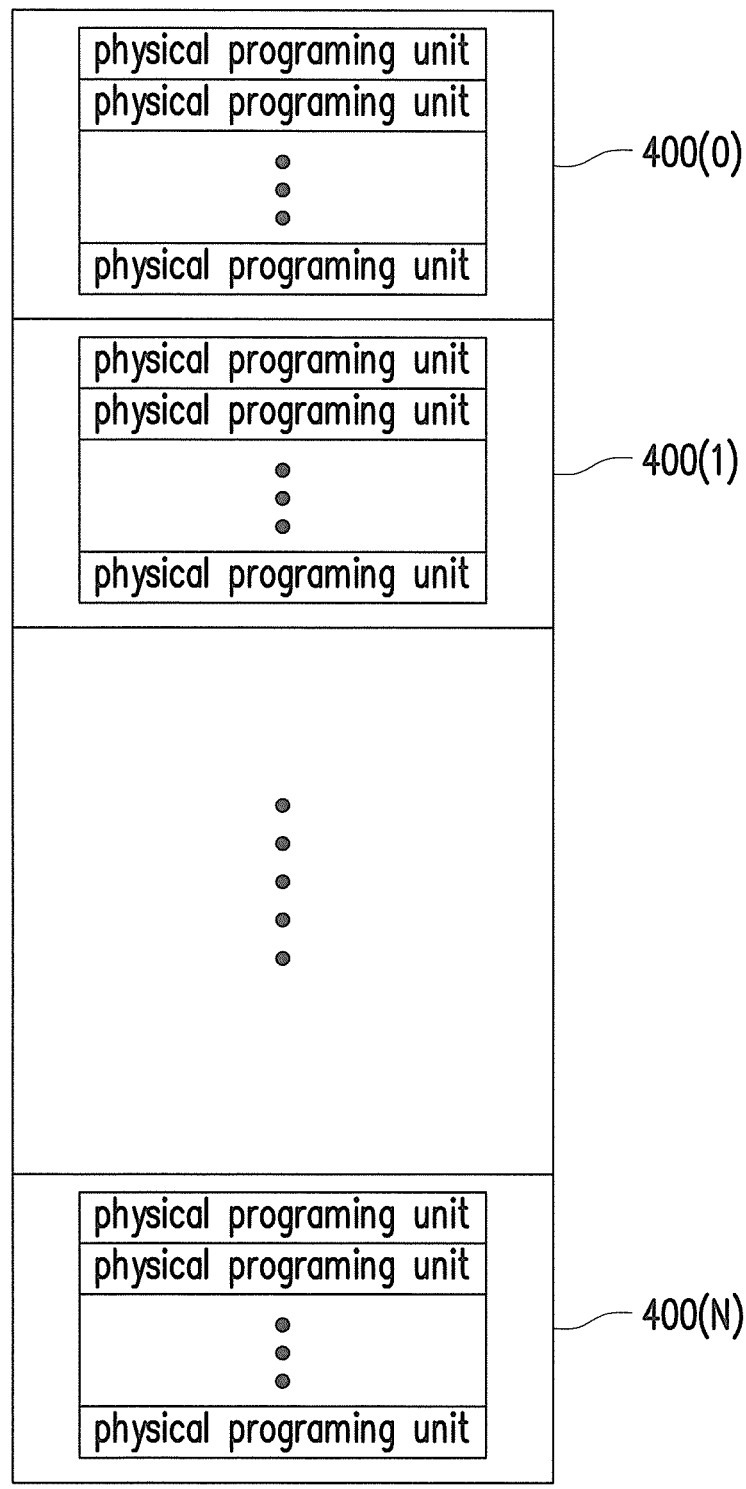
FIG. 10 is a schematic diagram illustrating a management of the rewritable non-volatile memory module according to an exemplary embodiment.

FIG. 10 is a schematic diagram illustrating a management of the rewritable non-volatile memory module according to an exemplary embodiment.

Referring to FIG. 10, the memory cells 702 of the rewritable non-volatile memory module 406 constitute a plurality of physical programming units, and the physical programming units constitutes a plurality of physical erasing units 400(0) to 400(N). Specifically, the memory cells on the same word line constitute one or more of the physical programming units. If each of the memory cells can store more than two bits, the physical programming units on the same word line can be classified into a lower physical programming unit and an upper physical programming unit. For instance, the LSB of each memory cell is the lower physical programming unit, and the MSB of each memory cell is the upper physical programming unit. Generally, in the MLC NAND flash memory, a writing speed of the lower physical programming unit is faster than a writing speed of the upper physical programming unit. In addition, under normal circumstances, a reliability of the lower physical programming unit is higher than a reliability of the upper physical programming unit.

In the present exemplary embodiment, the physical programming unit is a minimum unit for programming. That is, the physical programming unit is the minimum unit for writing data. For example, the physical programming unit is a physical page or a physical sector. When the physical programming unit is the physical page, each physical programming unit usually includes a data bit area and a redundancy bit area. The data bit area has multiple physical sectors configured to store user data, and the redundant bit area is configured to store system data (e.g., an error correcting code). In the present exemplary embodiment, each of the data bit areas contains 32 physical sectors, and a size of each physical sector is 512-byte (B). However, in other exemplary embodiments, the data bit area may also include 8, 16, or more or less of the physical sectors, and amount and sizes of the physical sectors are not particularly limited in the invention. On the other hand, the physical erasing unit is the minimal unit for erasing. Namely, each physical erasing unit contains the least number of memory cells to be erased together. For instance, the physical erasing unit is a physical block.

Figure 11:
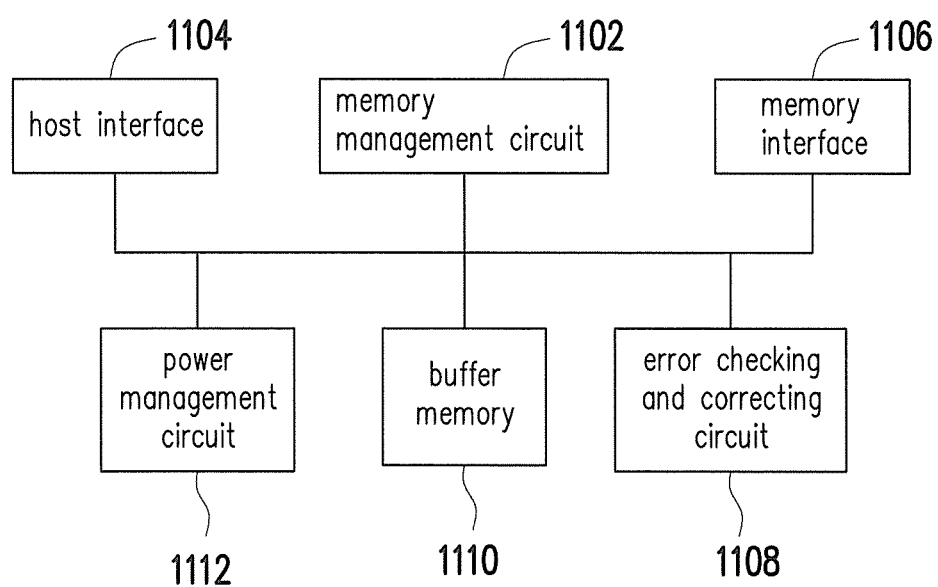
FIG. 11 is a schematic block diagram illustrating a memory controlling circuit unit according to an exemplary embodiment.

FIG. 11 is a schematic block diagram illustrating a memory controlling circuit unit according to an exemplary embodiment. It should be understood that, the structure of the memory controlling circuit unit depicted in FIG. 11 is only an example, and the invention is not limited thereto.

Referring to FIG. 11, the memory controlling circuit unit 404 includes a memory management circuit 1102, a host interface 1104, a memory interface 1106 and an error checking and correcting circuit 1108.

The memory management circuit 1102 is configured to control overall operations of the memory controlling circuit unit 404. Specifically, the memory management circuit 1102 has a plurality of control commands. During operations of the memory storage device 10, the control commands are executed to execute various operations such as writing, reading and erasing data. Operations of the memory management circuit 1102 are similar to the operations of the memory controlling circuit unit 404, thus related description is omitted hereinafter.

In the present exemplary embodiment, the control commands of the memory management circuit 1102 are implemented in a form of a firmware. For instance, the memory management circuit 1102 has a microprocessor unit (not illustrated) and a ROM (not illustrated), and the control commands are burned into the ROM. When the memory storage device 10 operates, the control commands are executed by the microprocessor to execute operations of writing, reading or erasing data.

In another exemplary embodiment of the invention, the control commands of the memory management circuit 1102 may also be stored as program codes in a specific area (for example, the system area in a memory exclusively used for storing the system data) of the rewritable non-volatile memory module 406. In addition, the memory management circuit 1102 has a microprocessor unit (not illustrated), a ROM (not illustrated) and a RAM (not illustrated). Particularly, the ROM has an activate code, which is executed by the microprocessor unit to load the control commands stored in the rewritable non-volatile memory module 406 to the RAM of the memory management circuit 1102 when the memory controlling circuit unit 404 is enabled. Thereafter, the control commands are executed by the microprocessor unit to execute operations of writing, reading or erasing data.

Further, in another exemplary embodiment of the invention, the control commands of the memory management circuit 1102 may also be implemented in a form of hardware. For example, the memory management circuit 1102 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured for managing the physical blocks of the rewritable non-volatile memory module 406; the memory writing circuit is configured for issuing a write command to the rewritable non-volatile memory module 406 in order to write data into the rewritable non-volatile memory module; the memory reading circuit is configured for issuing a read command to the rewritable non-volatile memory module 406 in order to read data from the rewritable non-volatile memory module 406; the memory erasing circuit is configured for issuing an erase command to the rewritable non-volatile memory module 406 in order to erase data from the rewritable non-volatile memory module 406; the data processing circuit is configured for processing both the data to be written into the rewritable non-volatile memory module 406 and the data to be read from the rewritable non-volatile memory module 406.

The host interface 1104 is coupled to the memory management circuit 1102 and configured to receive and identify commands and data sent from the host system 11. In other words, the commands and data sent from the host system 11 are passed to the memory management circuit 1102 through the host interface 1104. In the present exemplary embodiment, the host interface 1104 is compatible with a SATA standard. However, it should be understood that the present invention is not limited thereto, and the host interface 1104 may also be compatible with a PATA standard, an IEEE 1394 standard, a PCI Express standard, a USB standard, a SD standard, a UHS-I standard, a UHS-II standard, a MS standard, a MMC standard, a eMMC standard, a UFS standard, a CF standard, an IDE standard, or other suitable standards for data transmission.

The memory interface 1106 is coupled to the memory management circuit 1102 and configured to access the rewritable non-volatile memory module 406. That is, data to be written to the rewritable non-volatile memory module 406 is converted to a format acceptable to the rewritable non-volatile memory module 406 through the memory interface 1106. Specifically, if the memory management circuit 1102 intends to access the rewritable non-volatile memory module 406, the memory interface 1106 sends corresponding command sequences. The command sequences may include one or more signals, or data from the bus. For example, in a read command sequence, information such as identification codes and memory addresses are included.

The error checking and correcting circuit 1108 is coupled to the memory management circuit 1102 and configured to execute an error checking and correcting process to ensure the correctness of data. Specifically, when the memory management circuit 1102 receives the write command from the host system 11, the error checking and correcting circuit 1108 generates an error correcting code (ECC) and/or an error detecting code (EDC) for data corresponding to the write command, and the memory management circuit 1102 writes the data and the ECC and/or the EDC corresponding to the write command into the rewritable non-volatile memory module 406. Subsequently, when the memory management circuit 1102 reads the data from the rewritable non-volatile memory module 406, the corresponding ECC and/or the EDC is also read from the rewritable non-volatile memory module 106, so that the error checking and correcting circuit 1108 can execute the error checking and correcting procedure on the read data based on the ECC and/or the EDC. In the present exemplary embodiment, a low density parity code (LDPC) is used by the error checking and correcting circuit 1108. However, in another exemplary embodiment, the error checking and correcting circuit 1108 may also use a BCH code, a convolutional code, a turbo code, but the invention is not limited thereto.

In an exemplary embodiment, the memory controlling circuit unit 404 further includes a buffer memory 1110 and a power management circuit 1112.

The buffer memory 1110 is coupled to the memory management circuit 1102 and configured to temporarily store data and commands from the host system 11 or data from the rewritable non-volatile memory module 406.

The power management unit 1112 is coupled to the memory management circuit 1102 and configured to control a power of the memory storage device 10.

In the low density parity code, a valid codeword is defined by a parity check matrix. The parity check matrix is marked as a matrix H and a codeword is marked as CW hereinafter. According to an equation (1) below, if a result calculated by multiplying the parity check matrix H by the codeword CW is a zero vector, it indicates that the codeword CW is the valid codeword. Therein, an operator ⊗ represents a mod 2 matrix multiplication. In other words, a null space of the matrix H includes all the valid codewords. However, a content of the codeword CW is not particularly limited in the invention. For instance, the codeword CW may also include the error correcting code or the error detecting code generated by using any algorithms.

$$H \otimes CW^T = 0 \tag{1}$$

Therein, a dimension of the matrix H is k-by-n, and a dimension of the codeword CW is 1-by-n. Therein, k and n are positive integers. The codeword CW includes message bits and parity bits. Namely, the codeword CW may be represented by [M P], in which a vector M is constituted by the message bits, and a vector P is constituted by the parity bits. A dimension of the vector M is 1-by-(n–k), and a dimension of the vector P is 1-by-k. Hereinafter, the message bits and the parity bits are collectively referred to as data bits. In other words, the codeword CW includes n bits, in which a length of the message bits is (n–k) bits, and a length of the parity bits is k bits. Namely, a code rate of the codeword CW is (n–k)/n.

Generally, a generation matrix (marked as G hereinafter) is used during decoding, so that an equation (2) below may be satisfied by arbitrary values of the vector M. Therein, a dimension of the generation matrix G is (n–k)-by-n.

$$M \otimes G = [MP] = CW \qquad (2)$$

Therein, the codeword CW generated by the equation (2) is the valid codeword. Therefore, when the equation (2) is substituted into the equation (1), an equation (3) below may be obtained accordingly.

$$H \otimes G^T \otimes M^T = 0 \qquad (3)$$

Since the vector M may be arbitrary values, an equation (4) below may definitely be satisfied. In other words, after the parity check matrix H is decided, the corresponding generation matrix G may also be decided.

$$H \otimes G^T = 0 \qquad (4)$$

While decoding for the codeword CW, a parity check procedure is first executed on the data bits in the codeword. For instance, the parity check matrix H may be multiplied by the codeword CW to generate a vector (hereinafter, marked as S, as shown in an equation (5) below). If the vector S is the zero vector, the codeword CW may be directly outputted. If the vector S is not the zero vector, it indicates that the codeword CW is not the valid codeword.

$$H \otimes CW^T = S \qquad (5)$$

A dimension of the vector S is k-by-1, in which each element is also known as a syndrome. If the codeword CW is not the valid codeword, the error checking and correcting circuit 1108 may execute a decoding procedure attempting to correct an error bit in the codeword CW.

Figure 12:
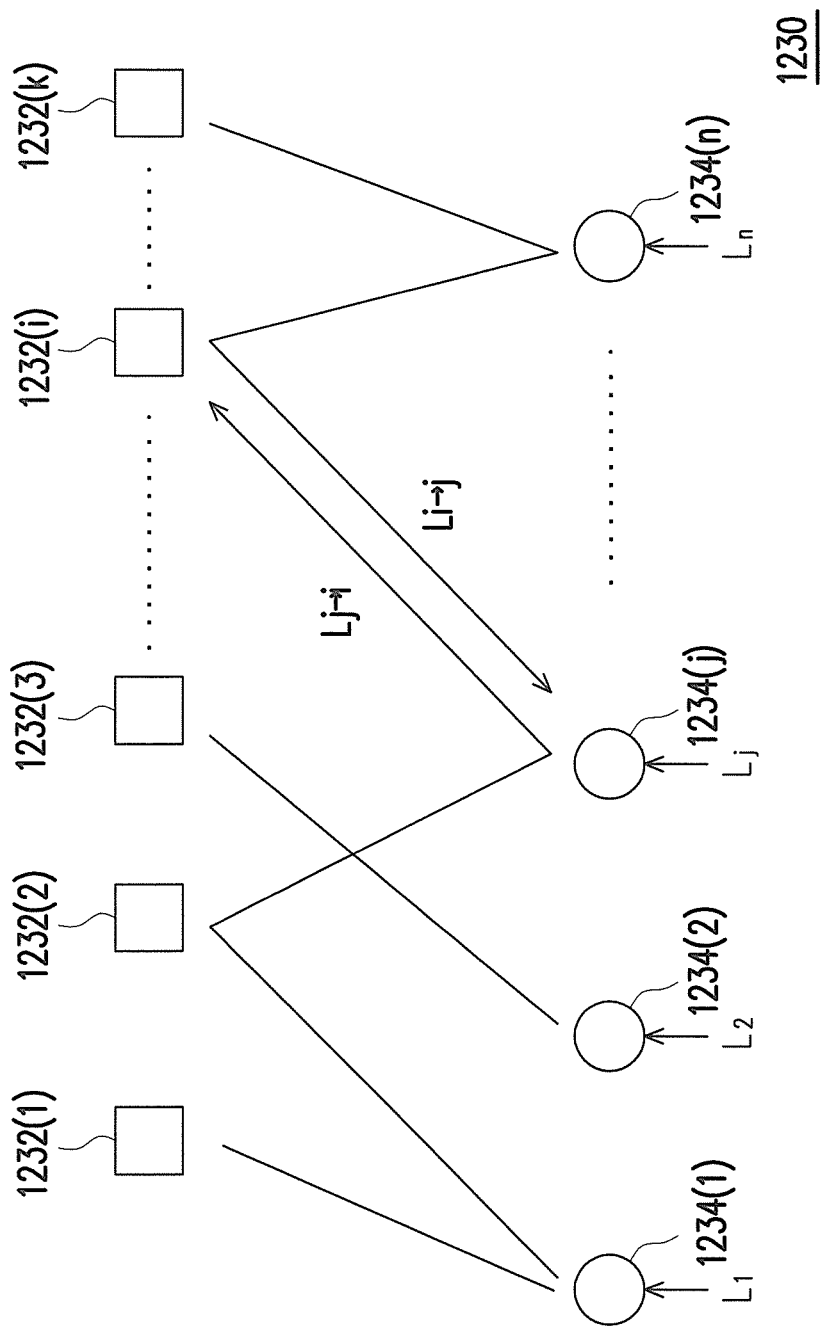
FIG. 12 is a schematic diagram illustrating a parity check matrix according to an exemplary embodiment.

FIG. 12 is a schematic diagram illustrating a parity check matrix according to an exemplary embodiment.

Referring to FIG. 12, generally, the parity check matrix H may be represented by a bipartite graph 1230 which includes parity nodes 1232(1) to 1232(k) and message nodes 1234(1) to 1234(n). Each of the parity nodes 1232(1) to 1232(k) is corresponding to one syndrome, and each of the message nodes 1234(1) to 1234(n) is corresponding to one data bit. Corresponding relations between the data bits and the syndromes (i.e., connecting relation between the message nodes 1234(1) to 1234(n) and the parity nodes 1232(1) to 1232(k)) is generated according to the parity check matrix. More specifically, if an element at a $i^{th}$ column and a $j^{th}$ row is 1, a $i^{th}$ parity node 1232(i) is connected to a $j^{th}$ message node 1234(j), and i and j are positive integers.

When the memory management circuit 1102 reads a n number of data bits (which forms one codeword) from the rewritable non-volatile memory module 406, the memory management circuit 1102 may also obtain a channel reliability of each of the data bits. These channel reliabilities are used to represent probabilities (or known as a reliance level) of one specific data bit to be decoded into "1" or "0", detailed description thereof will be provided below. In the bipartite graph 1230, the message nodes 1234(1) to 1234(n) may also receive the corresponding channel reliabilities. For instance, the message node 1232(1) may receive a channel reliability $L_1$ of a first data bit, and the message node 1232(j) may receive a channel reliability $L_j$ of a $j^{th}$ data bit.

The error checking and correcting circuit 1108 may execute the decoding procedure according to a structure of the bipartite graph 1230 and the channel reliabilities $L_1$ to $L_n$. The decoding procedure may include an iterative decoding. Specifically, in the iterative decoding, the message nodes 1234(1) to 1234(n) may calculate and provide the reliabilities to the parity nodes 1232(1) to 1232(k), and the parity nodes 1232(1) to 1232(k) may also calculate and provide the reliabilities to the message nodes 1234(1) to 1234(n). The reliabilities are transmitted along edges in the bipartite graph 1230. For instance, the reliability $L_{i \to j}$ is one transmitted from the parity node 1232(i) to the message node 1234(j), and the reliability $L_{j \to i}$ is one transmitted from the message node 1234(j) to the parity node 1232(i). These reliabilities are used to represent probabilities (or, the reliance level) of one specific data bit to be decoded into "1" or "0", which are considered by one node. For instance, the reliability $L_{j \to i}$ represents the reliance level (which may be positive or negative) for the $j^{th}$ data bit being decoded into "1" or "0" which is considered by the message node 1234(j), the reliability $L_{i \to j}$ represents the reliance level for the $j^{th}$ data bit being decoded into "1" or "0" which is considered by the message node 1232(i). The message nodes 1234(1) to 1234(n) and the parity nodes 1232(1) to 1232(k) may calculate reliabilities to be outputted according to the reliability being inputted, which is similar to that in calculating the conditional probabilities of one specific data bit to be decoded into "1" or "0". Therefore, above-mentioned process of transmitting the reliabilities is also known as a belief propagation.

Based on different algorithms being adopted, different reliabilities may be calculated by the message nodes 1234(1) or 1234(n) and/or the parity nodes 1232(1) to 1232(k). For instance, the error checking and correcting circuit 1108 may adopt a Sum-Product Algorithm, a Min-Sum Algorithm, or a bit-flipping Algorithm, but the algorithm being adopted is not particularly limited in the invention.

In each iteration of the iterative decoding, the message nodes 1234(1) to 1234(n) may transmit the reliabilities to the parity nodes 1232(1) to 1232(k), and the parity nodes 1232(1) to 1232(k) may transmit the reliabilities to the message nodes 1234(1) to 1234(n). After each iteration, the message nodes 1234(1) to 1234(n) may calculate the probabilities of each data bit to be decoded into "1" or "0" according to the current reliability. Subsequently, the parity check procedure is executed on the calculated data bit. Namely, the codeword generated by the data bit is multiplied by the parity check matrix, so as to determine whether such codeword is the valid codeword. If the generated codeword is the valid codeword, the iterative decoding is stopped. If the generated codeword is not the valid codeword, the next iteration is executed. When a number of iterations in the iterative decoding exceeds a preset value, the iterative decoding is also stopped, indicating that the decoding fails.

Figure 13:
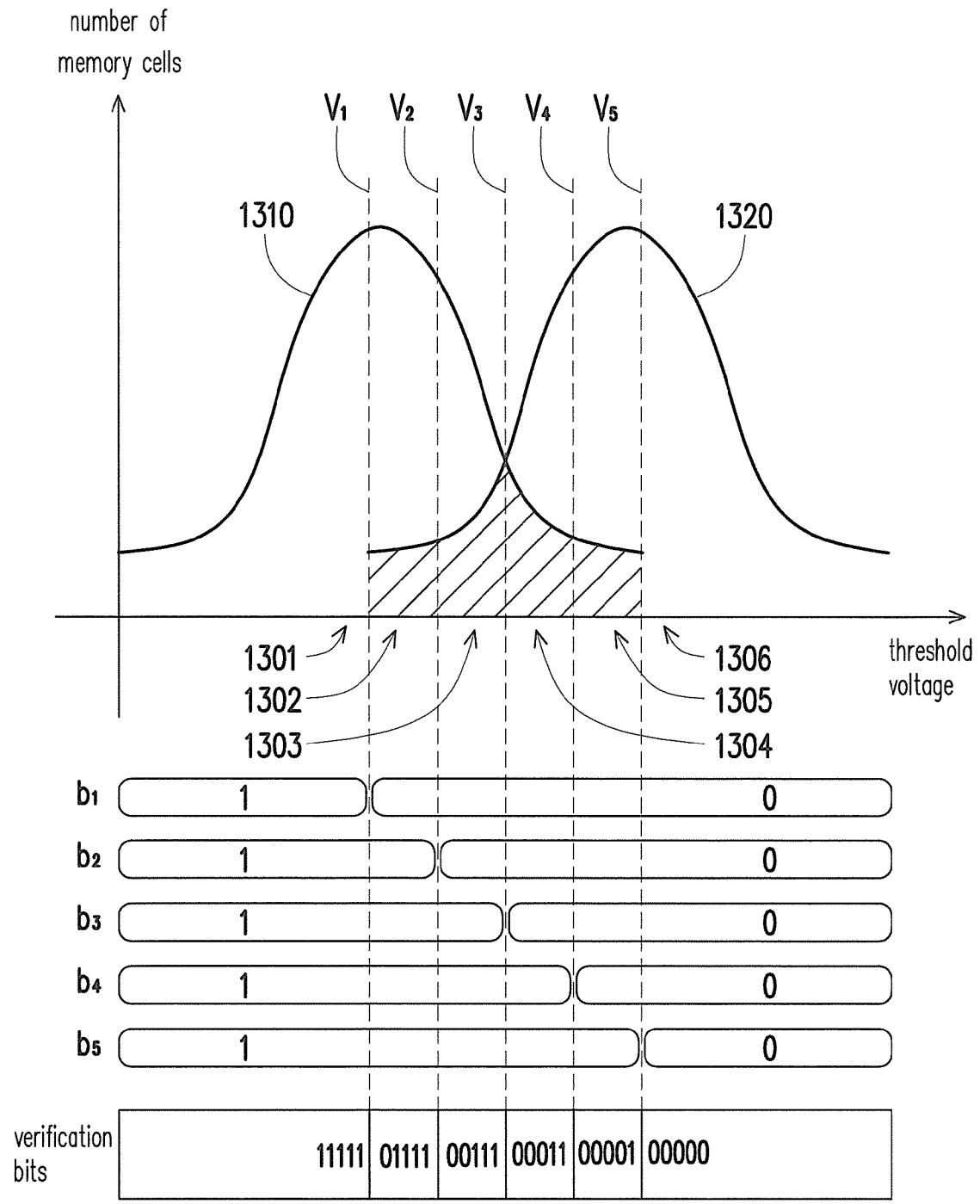
FIG. 13 illustrates a schematic diagram for reading a verification bit according to an exemplary embodiment.

FIG. 13 illustrates a schematic diagram for reading a verification bit according to an exemplary embodiment. Referring to FIG. 13, it is assumed that the memory cell in a storage status 1310 stores the bit "1", and the memory cell in a storage status 1320 stores the bit "0". The storage status 1310 may be partially overlapped with the storage status 1320, namely, under some specific read voltages, a part of the memory cells in the storage status 1310 may be determined as belonging to the storage status 1320, and a part of the memory cells in the storage status 1320 may be determined as belonging to the storage status 1310. In an exemplary embodiment, when a read voltage is applied to the control gate of the memory cell, the verification bit obtained by the memory management circuit 1102 may be "0" or "1" depended on whether the channel of the memory cell is turned on. Hereinafter, it is assumed that the corresponding verification bit is "0" when the channel of the memory cell is not turned on; otherwise, it is "1". When the memory management circuit 1102 applies read voltages $V_1$ to $V_5$ to one specific memory cell, 5 verification bits may be obtained by the memory management circuit 1102. More specifically, the read voltage $V_1$ is corresponding to the verification bit $b_1$; the read voltage $V_2$ is corresponding to the verification bit $b_2$; the read voltage $V_3$ is corresponding to the verification bit $b_3$; the read voltage $V_4$ is corresponding to the verification bit $b_4$; and the read voltage $V_5$ is corresponding to the verification bit $b_5$. The memory management circuit 1102 may obtain the verification bit from the verification bit $b_1$ to the verification bit $b_5$ in following manner: when the threshold voltage of one memory cell falls within an interval 1301, the verification bit is "11111"; when the threshold voltage of one memory cell falls within an interval 1302, the verification bit is "01111"; when the threshold voltage of one memory cell falls within an interval 1303, the verification bit is "00111"; when the threshold voltage of one memory cell falls within an interval 1304, the verification bit is "00011"; when the threshold voltage of one memory cell falls within an interval 1305, the verification bit is "00001"; and when the threshold voltage of one memory cell falls within an interval 1306, the verification bit is "00000". In another exemplary embodiment, the rewritable non-volatile memory module 406 may also transmit, after calculating the verification bits $b_1$ to $b_5$, the calculated verification bits to the memory management circuit 1102. For instance, an exclusive OR calculation may be executed on the verification bits $b_2$ and $b_4$, an exclusive OR calculation may be executed on the verification bits $b_1$ and $b_5$. Accordingly, only 3 verification bits are obtained by the memory management circuit 1102. However, a number and a content of the verification bits are not particularly limited in the invention.

In the present exemplary embodiment, one of the read voltages $V_1$ to $V_5$ is set to a sign read voltage. The sign read voltage is used to decide the data bit. For instance, if the read voltage $V_3$ is a sign read voltage, the data bit is identical to the verification bit $b_3$; and if the read voltage $V_2$ is the sign read voltage, the data is identical to the verification bit $b_2$, and the rest may be deduced by analogy. In each interval, based on the probability of the memory cell belonging to the storage status 1310 and the probability of the memory cell belonging to the storage status 1320, a log likelihood ratio (LLR) may be calculated, and the log likelihood ratio is also known as the channel reliability of the data bits in the present exemplary embodiment. In an exemplary embodiment, the log likelihood ratio corresponding to each of the intervals may be calculated and stored in a lookup table in advance. The memory management circuit 1102 may input the verification bits $b_1$ to $b_5$ to the lookup table, so as to obtain the corresponding log likelihood ratio to serve as the channel reliability. The obtained channel reliability (i.e., $L_1$ to $L_n$ in FIG. 12) may be used to execute said iterative decoding. In an exemplary embodiment, when different sign read voltages are set, the channel reliability may be obtained by using different lookup tables.

In the foregoing exemplary embodiment, if a number of the read voltages is x, a (x+1) number of the intervals can be divided, and x is a positive integer. However, in another exemplary embodiment, if a number of the read voltages is x, a y number of the intervals can be divided, and y may be any positive integers. The invention is not intended to limit the number of the intervals produced from the x number of the read voltages. If the number of the read voltages is 1 (e.g., only the read voltage $V_3$ is used), the decoding procedure being executed is also known as a hard bit mode decoding procedure. If the number of the read voltages is greater than 1, the decoding procedure being executed is also known as a soft bit mode decoding procedure. Generally, information used by the soft bit mode decoding procedure is relatively more, such that more of error bits may be corrected, but an executing speed thereof is slower. Further, in an exemplary embodiment, when the hard bit mode decoding procedure is executed, the memory management circuit 1102 may calculate the channel reliability directly through the obtained verification bit without using the lookup table. For instance, if the verification bit is "1", the channel reliability may be set to z; and if the verification bit is "0", the channel reliability may be set to −z, in which z is a real number.

In the present exemplary embodiment, parts or all of the physical programming units in the rewritable non-volatile memory module 406 are grouped into a first type physical programming unit or a second type physical programming unit. In the present exemplary embodiment, whether one physical programming unit belongs to the first type physical programming unit or the second type physical programming unit is distinguished according a reliability of that physical programming unit. The reliability of a physical programming unit that belongs to the first type physical programming unit is lower than the reliability of a physical programming unit that belongs to the second type physical programming unit. The reliability of one physical programming unit is related to a probability of errors occurred in the data stored in that physical programming unit. If the reliability of one physical programming unit is higher, it indicates that the probability of errors occurred in the data stored in that physical programming unit is lower. If the reliability of one physical programming unit is lower, it indicates that the probability of errors occurred in the data stored in that physical programming unit is higher. In other words, the probability of errors occurred in the data stored in the first type physical programming unit is higher than the probability of errors occurred in the data stored in the second type physical programming unit.

In the present exemplary embodiment, the memory management circuit 1102 determines whether one physical programming unit belongs to the first type physical programming unit or the second type physical programming unit according a preset property of that physical programming unit. Usually, the preset property does not change over time or change based on a usage level of the physical programming unit. In the present exemplary embodiment, the preset property of one physical programming unit include an indication of whether that physical programming unit belongs to the upper physical programming unit or the lower physical programming unit. If one physical programming unit belongs to the upper physical programming unit, such physical programming unit is determined as belonging to the first type physical programming unit. If one physical programming unit belongs to the lower physical programming unit, such physical programming unit is determined as belonging to the second type physical programming unit. Further, in an exemplary embodiment, the preset property of one physical programming unit may also include an indication of whether that physical programming unit is configured to store the data which is relatively more important (e.g., the system data or the user data). If one physical programming unit is configured to store the data which is more important, such physical programming unit is determined as belonging to the first type physical programming unit.

In an exemplary embodiment, it is possible that the reliability of one physical programming unit changes over time or changes based on the usage level. Accordingly, it also possible that whether one physical programming unit belongs to the first type physical programming unit or the second type physical programming unit changes over time and/or changes based on the usage level. For example, in an exemplary embodiment, the memory management circuit 1102 determines whether the reliability of one physical programming unit is less than a threshold. If the reliability of the physical programming unit is less than the threshold, the memory management circuit 1102 determines that the physical programming unit belongs to the first type physical programming unit. If the reliability of the physical programming unit is not less than the threshold, the memory management circuit 1102 determines that the physical programming unit belongs to the second type physical programming unit. For example, in an exemplary embodiment, in the case where the rewritable non-volatile memory module is never been used, it is possible that all or most of the physical programming units in such rewritable non-volatile memory module belong to the second type physical programming unit. With increases in an usage time and/or the usage level of each physical programming unit (i.e., when the physical programming unit is written or erased repeatedly for over a predetermined number of times), a part of the physical programming units in the rewritable non-volatile memory module which belongs to the second type physical programming unit may change into the first type physical programming unit.

In an exemplary embodiment, the reliability of one physical programming unit is related to a bit error rate (BER) of that physical programming unit. For example, in an exemplary embodiment, the reliability of one physical programming unit is negatively correlated to the bit error rate of that physical programming unit. Therefore, the bit error rate of the physical programming unit that belongs to the first type physical programming unit is higher than the bit error rate of the physical programming unit that belongs to the second type physical programming unit. In another exemplary embodiment, the reliability of one physical programming unit may also be related to the usage level of that physical programming unit. Each of the physical programming units is corresponding to one usage level value. This usage level value is configured to indicate the usage level of one physical programming unit. For example, the usage level of one physical programming unit includes at least one of an erasing count, a writing count, a reading count and data storage time, or a combination thereof, but the invention is not limited thereto. The memory management circuit 1102 may determine the reliability of one physical programming unit according to the bit error rate and/or the usage level value of that physical programming unit.

In the present exemplary embodiment, whether one physical programming unit belongs to the first type physical programming unit or the second type physical programming unit may be determined in advance and stored in at least one lookup table, or may also be instantly determined. For example, if one physical programming unit is selected to store data corresponding to a write command or a garbage collection procedure, the memory management circuit 1102 may determine whether that physical programming unit belongs to the first type physical programming unit or the second type physical programming unit by searching the at least one lookup table or instantly according to the information (e.g., the preset property, the bit error rate, the usage level value and/or the reliability) of the physical programming unit. If the physical programming unit for storing the data belongs to the first type physical programming unit, the memory management circuit 1102 may use the ECC and/or the EDC with longer data length to protect that data. If the physical programming unit for storing the data belongs to the second type physical programming unit, the memory management circuit 1102 may use the ECC and/or the EDC with shorter data length to protect that data. The ECC and/or the EDC with longer data length may be used to detect more of the error bits. The ECC and/or the EDC may be used independently or together, which are not particularly limited in the invention. Hereinafter, the ECC and/or the EDC are collectively referred to as a verification code.

In an exemplary embodiment, the memory management circuit 1102 may identify the physical programming unit using a first programming mode as the first type physical programming unit, and identify the physical programming unit using a second programming mode as the second type physical programming unit. When one physical programming unit uses the first programming mode (also known as a MLC or a TLC mode), each memory cell in that physical programming unit stores a first number of bit data, and the first number is not less than 2. For example, in the present exemplary embodiment, the first number is 2 or 3. In the present exemplary embodiment, the second programming mode may be at least one of a SLC mode, a lower physical programming unit programming mode, a mixture programming mode and a less layer cell mode, or a combination thereof. When one physical programming unit uses the SLC mode, each memory cell in that physical programming unit stores only one bit data. When one physical programming unit uses the lower physical programming unit programming mode, that physical programming unit belongs to the lower physical programming unit; further, only this physical programming unit is programmed, whereas the upper physical programming unit corresponding to this physical programming unit may be programmed or may not be programmed. When one physical programming unit uses the mixture programming mode and that physical programming unit belongs to the lower physical programming unit, valid data are programmed into this physical programming unit. When one physical programming unit uses the mixture programming mode and that physical programming unit belongs to the upper physical programming unit, the valid data are not programmed into this physical programming unit. When one physical programming unit uses the mixture programming mode and that physical programming unit belongs to the lower physical programming unit, real data are programmed into this physical programming unit. When one physical programming unit uses the mixture programming mode and that physical programming unit belongs to the upper physical programming unit, dummy data corresponding to the real data are programmed into this physical programming unit. When one physical programming unit uses the less layer cell mode, each memory cell in that physical programming unit stores a second number of bit data, and the second number is less than the first number. In the present exemplary embodiment, the second number is 1. In the present exemplary embodiment, the reliability of the physical programming unit using the first programming mode is usually lower than the physical programming unit using the second programming mode.

Figure 14:
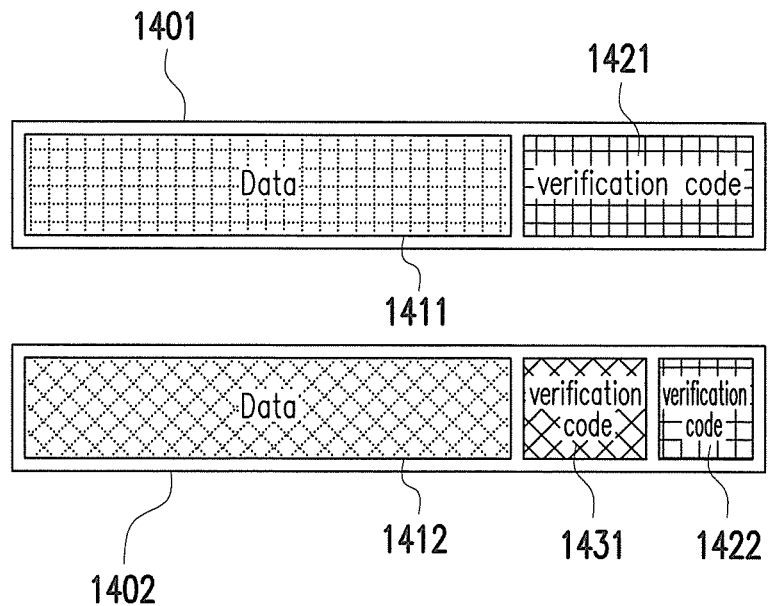
FIG. 14 and FIG. 15 are schematic diagrams for writing data according to an exemplary embodiment of the invention.
Figure 15:
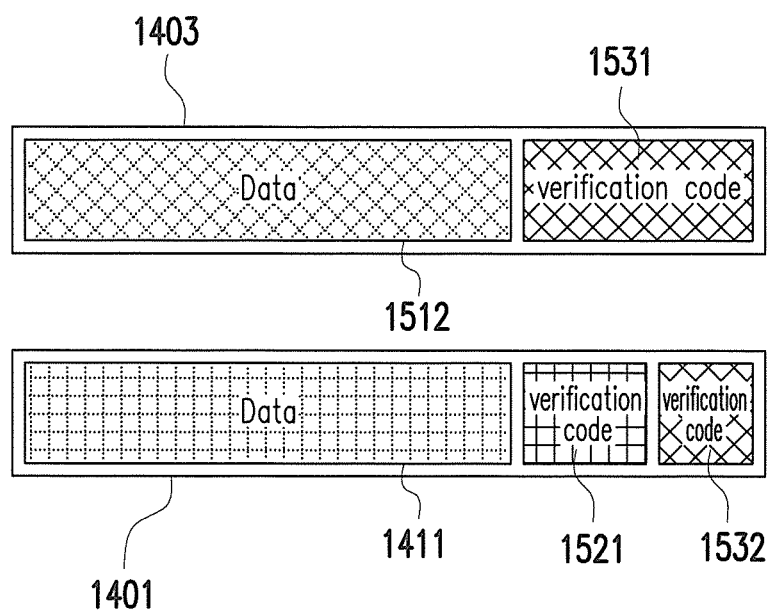

FIG. 14 and FIG. 15 are schematic diagrams for writing data according to an exemplary embodiment of the invention.

Referring to FIG. 14, in the present exemplary embodiment, as in response to a garbage collection procedure or a write command from the host system 11, if the memory management circuit 1102 intends to write data 1411 (also known as first data) into a physical programming unit 1401

(also known as a first physical programming unit), the memory management circuit 1102 determines whether the physical programming unit 1401 belongs to the first type physical programming unit or the second type physical programming unit. Descriptions regarding how to determine whether one physical programming unit belongs to the first type physical programming unit or the second type physical programming unit have been provided in detail above, which are not repeated hereinafter. If the physical programming unit 1401 belongs to the first type physical programming unit, the error checking and correcting circuit 1108 generates a verification code 1421 (also known as a first verification code) and a verification code 1422 (also known as a second verification code) in correspondence to the data 1411. Among them, the verification code 1421 may be used independently or combined with the verification code 1422. However, the verification code 1422 cannot be used independently. The verification code 1421 or a combination of the verification code 1421 and the verification code 1422 may be used to verify the data 1411. The memory management circuit 1102 may write the data 1411 and the verification code 1421 into the physical programming unit 1401, and store the verification code 1422 into one or more physical programming units that belong to the second type physical programming unit.

It should be noted that, the invention is not intended to limit that the verification code 1422 (the verification code that cannot be used independently) to be stored into the one or more physical programming units that belong to the second type physical programming unit only. That is, in another exemplary embodiment, based on design plan of manufacturers, the verification code that cannot be used independently may be stored in a storage area planned in advance (e.g., a plurality of physical erasing units being pre-defined).

Referring to FIG. 15, if the physical programming unit 1401 belongs to the second type physical programming unit, the error checking and correcting circuit 1108 generates a verification code 1521 (also known as a third verification code) in correspondence to the data 1411. Among them, the verification code 1521 may be used independently to verify the data 1411. The memory management circuit 1102 writes the data 1411, the verification code 1521 and a verification code 1532 (also known as a fourth verification code) into the physical programming unit 1401. In addition, in another exemplary embodiment of FIG. 15, while programming the physical programming unit 1401, the memory management circuit 1102 determines whether the verification code 1532 exists. If the verification code 1532 exists, the memory management circuit 1102 writes the data 1411, the verification code 1521 and the verification code 1532 altogether into the physical programming unit 1401. If the verification code 1532 does not exist, the memory management circuit 1102 only writes the data 1411 and the verification code 1521 into the physical programming unit 1401. It is worth mentioning that, although the verification codes 1421 and 1521 may be used independently to verify the data 1411, a data length of the verification code 1521 is shorter than the data length of the verification code 1421. The verification code 1532 cannot be used independently. The data length of the verification code 1532 is, for example, equal to the data length of the verification code 1422. In the present exemplary embodiment, the verification code 1532 is configured for being combined with a verification code 1531 (also known as a fifth verification code) stored in a physical programming unit 1403 (also known as a second physical programming unit) that belongs to the first type physical programming unit. Among them, the verification code 1531 is generated by the error checking and correcting circuit 1108 in correspondence to data 1512 (also known as second data). The data length of the verification code 1531 is, for example, equal to the data length of the verification code 1421. The verification code 1531 or a combination of the verification code 1531 and the verification code 1532 may be used to verify the data 1512.

In an exemplary embodiment of FIG. 14, if the memory management circuit 1102 intends to write data 1412 (also known as third data) and a verification code 1431 (also known as an eighth verification code) into a physical programming unit 1402 (also known as a third physical programming unit) belonging to the second type physical programming unit, the memory management circuit 1102 writes the data 1412, the verification code 1431 and the verification code 1422 altogether into the physical programming unit 1402. Among them, the verification code 1431 is generated by the error checking and correcting circuit 1108 in correspondence to the data 1412. The verification code 1431 may be used independently to verify the data 1412. The data length of the verification code 1431 is equal to the data length of the verification code 1521. Furthermore, in an exemplary embodiment, the data length of the verification code 1421 is equal to a total of the data length of the verification code 1431 and the data length of the verification code 1422. Similarly, in an exemplary embodiment, the data length of the verification code 1531 is equal to a total of the data length of the verification code 1521 and the data length of the verification code 1532.

Figure 16:
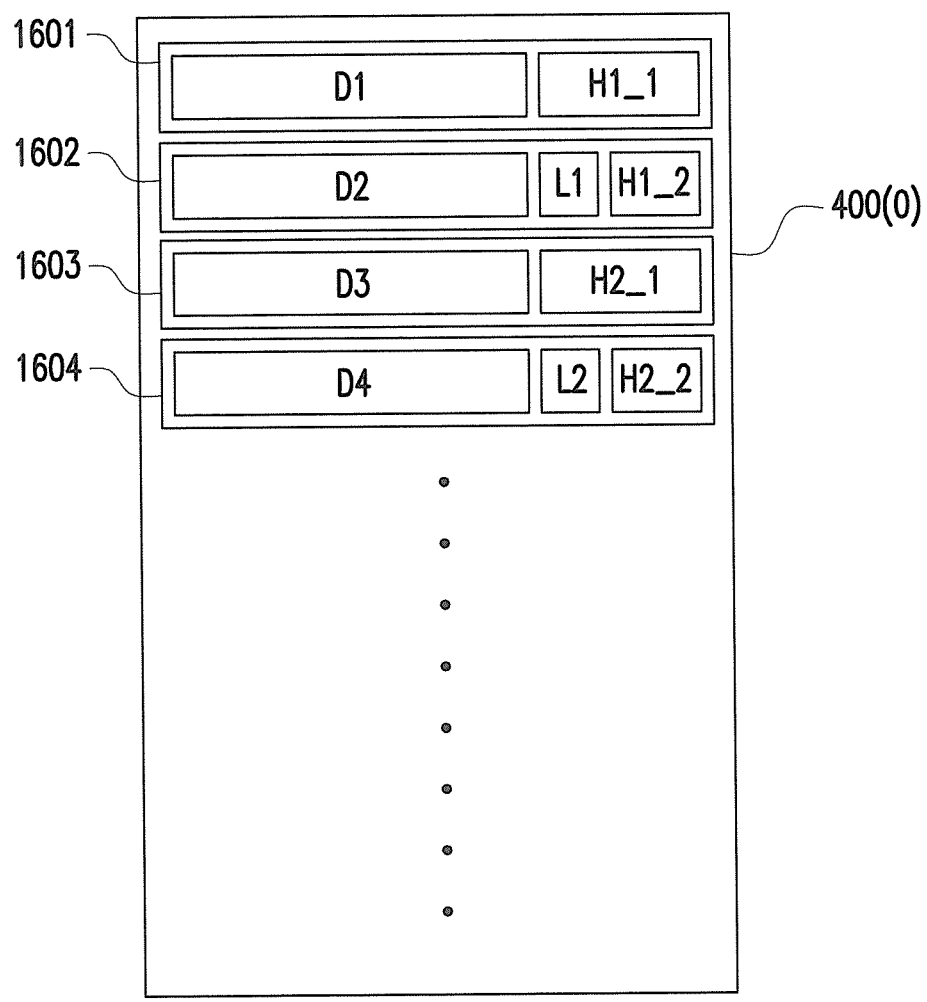
FIG. 16 is a schematic diagram for writing data according to another exemplary embodiment of the invention.

FIG. 16 is a schematic diagram for writing data according to another exemplary embodiment of the invention.

Referring to FIG. 16, as in response to at least one garbage collection procedure or a write command from the host system 11, the memory management circuit 1102 intends to write data D1 to D4 into physical programming units 1601 to 1604 in the physical erasing unit 400(0), respectively. Among them, the physical programming units 1601 and 1063 belong to the first type physical programming unit, and the physical programming units 1602 and 1604 belong to the second type physical programming unit. With respect to the data D1, the error checking and correcting circuit 1108 generates a verification code H1_1 corresponding to the data D1 and a verification code H1_2 for being combined with the verification code H1_1. Then, while programming the physical programming unit 1601, the memory management circuit 1102 writes the data D1 and the verification code H1_1 into the physical programming unit 1601. With respect to the data D2, the error checking and correcting circuit 1108 generates a verification code L1 corresponding to the data D2. Then, while programming the physical programming unit 1602, the memory management circuit 1102 writes the data D2, the verification code L1 and the verification code H1_2 into the physical programming unit 1602. With respect to the data D3, the error checking and correcting circuit 1108 generates a verification code H2_1 corresponding to the data D3 and a verification code H2_2 for being combined with the verification code H2_1. Then, while programming the physical programming unit 1603, the memory management circuit 1102 writes the data D3 and the verification code H2_1 into the physical programming unit 1603. With respect to the data D4, the error checking and correcting circuit 1108 generates a verification code L2 corresponding to the data D4. Then, while programming the physical programming unit 1604, the memory management circuit 1102 writes the data D4, the verification code L2 and the verification code H2_2 into the physical programming unit 1604. The exemplary embodiment of FIG. 16 uses sequential write as an example. However, according to another exemplary embodiment, aforementioned operation may also be operated in random write.

In the present exemplary embodiment, after a read command from the host system 11 is received, the memory management circuit 1102 may determine whether the physical programming unit storing the data to be read belongs to the first type physical programming unit or the second type physical programming unit. The memory management circuit 1102 and the error checking and correcting circuit 1108 may execute a corresponding decoding operation according to whether the physical programming unit storing the data to be read belongs to the first type physical programming unit or the second type physical programming unit.

Referring back to FIG. 14, after a read command from the host system 11 that instructs to read the data 1411 is received, the memory management circuit 1102 reads the data 1411 and the verification code 1421 from the physical programming unit 1401 according to that read command. The error checking and correcting circuit 1108 executes a decoding (also known as a first decoding) on the data 1411 according to the verification code 1421 and determines whether the data is decoded successfully. If the data is decoded unsuccessfully (i.e., decoding fail), the memory management circuit 1102 combines the verification code 1421 and the verification code 1422 to re-decode the data. Specifically, the error checking and correcting circuit 1108 determines whether a valid codeword is generated after executing the first decoding on the data 1411 according to the verification code 1421. If the valid codeword is generated by the first decoding (i.e., the data is decoded successfully), the memory management circuit 1102 outputs the valid codeword or the data corresponding to the valid codeword. If the valid codeword is not generated by the first decoding (i.e., the data is decoded unsuccessfully), the memory management circuit 1102 reads the verification code 1422 from the physical programming unit 1402, combines the verification code 1421 and the verification code 1422 into a new verification code (also known as a seventh verification code), and execute another decoding (also known as a second decoding) on the data 1411 according to the seventh verification code. It should be noted that, in the present exemplary embodiment, the first decoding and the second decoding belong to the iterative decoding which uses, for example, a low density parity code algorithm. However, in another exemplary embodiment, the first decoding and the second decoding may also use any decoding algorithms, which are not particularly limited in the invention.

Specifically, the memory management circuit 1102 combines the verification code 1421 and the verification code 1422 in order to obtain the new verification code composed of a N number of bits. Among them, the verification code 1421 is composed of a first to a $M^{th}$ bits among the N number of bits, and the verification code 1422 is composed of a $(M+1)^{th}$ to a $N^{th}$ bits among the N number of bits. In other words, the data length of the new verification code obtained by combining the verification code 1421 and the verification code 1422 is the N number of bits if the data length of the verification code 1421 is a M number of bits and the data length of the verification code 1422 is a (N−M) number of bits. Therein, N and M are positive integers. Particularly, in an exemplary embodiment, the new verification code obtained by combining the verification code 1421 and the verification code 1422 is corresponding to a preset generation matrix G, and the verification code 1421 is corresponding to a sub-matrix of this preset generation matrix G. The sub-matrix is composed of parts of columns and rows of the generation matrix G. However, in another exemplary embodiment, the verification codes for being combined with each other (e.g., the verification code 1421 and the verification code 1422) may also be generated by using any designed algorithms, which are not particularly limited in the invention. In an exemplary embodiment, the first decoding and the second decoding belong to the hard bit mode decoding procedure as described previously. If the data is still decoded unsuccessfully by using the new verification code, the memory management circuit 1102 can instruct the rewritable non-volatile memory module 406 to re-read the data 1411 by using a new read voltage in order to execute another decoding (also known as a third decoding), and/or instruct the error checking and correcting circuit 1108 to execute the third decoding by using the soft bit mode decoding procedure. However, in another exemplary embodiment, the first decoding and/or the second decoding may also belong to the soft bit mode decoding procedure or use any decoding algorithms.

In addition, after the read command from the host system 11 that instructs to read the data 1412 is received, the memory management circuit 1102 reads the data 1412 and the verification code 1431 from the physical programming unit 1402 according to that read command. The error checking and correcting circuit 1108 executes the decoding on the data 1412 according to the verification code 1431 and determines whether the valid codeword is generated by the decoding. If the valid codeword is generated by the decoding (i.e., the data is decoded successfully), the memory management circuit 1102 outputs the valid codeword or data corresponding to the valid codeword. If the valid codeword is not generated by the decoding (i.e., the data is decoded unsuccessfully or the decoding fails), the memory management circuit 1102 may instruct the rewritable non-volatile memory module 406 to re-read the data 1412 by using a new read voltage in order to execute another decoding, and/or instruct the error checking and correcting circuit 1108 to execute another decoding by using the soft bit mode decoding procedure.

Referring back to FIG. 15, after a read command from the host system 11 that instructs to read the data 1512 is received, the memory management circuit 1102 reads the data 1512 and the verification code 1531 from the physical programming unit 1403 according to that read command. The error checking and correcting circuit 1108 executes the first decoding on the data 1512 according to the verification code 1531 and determines whether the valid codeword is generated by the first decoding. If the valid codeword is generated by the first decoding (i.e., the data is decoded successfully), the memory management circuit 1102 outputs the valid codeword or the data corresponding to the valid codeword. If the valid codeword is not generated by the first decoding (i.e., the data is decoded unsuccessfully), the memory management circuit 1102 reads the verification code 1532 from the physical programming unit 1401, combines the verification code 1531 and the verification code 1532 into a new verification code (also known as a sixth verification code), and execute the second decoding on the data 1512 according to the sixth verification code.

Specifically, the memory management circuit 1102 combines the verification code 1531 and the verification code 1532 in order to obtain the new verification code composed of a N number of bits. Among them, the verification code 1531 is composed of a first to a $M^{th}$ bits among the N number of bits, and the verification code 1532 is composed of a (M+1)$^{th}$ to a N$^{th}$ bits among the N number of bits. Architectures and usages of the verification code 1531 and the verification code 1532 are similar to those of the verification code 1421 and the verification code 1422, and thus related descriptions thereof are not repeated hereinafter. In addition, the decoding operations for the data 1512 and the data 1411 in the exemplary embodiment of FIG. 15 are respectively identical or similar to the decoding operations for the data 1411 and the data 1412 in the exemplary embodiment of FIG. 14, which are not repeated hereinafter. In addition, aforesaid decoding operations may also be applied in the exemplary embodiment of FIG. 16 for reading and verifying the data D1 to D4.

In an exemplary embodiment, the memory management circuit 1102 generates the verification code with a specific length according to the reliability of the physical programming unit configured to store specific data. Take aforesaid first physical programming unit configured to store the first data as an example, in an exemplary embodiment, the memory management circuit 1102 may determine whether the reliability of the first physical programming unit belongs to a first type reliability or a second type reliability. For example, if the reliability of the first physical programming unit is less than a threshold, the memory management circuit 1102 determines that the reliability of the first physical programming unit belongs to the first type reliability; and if the reliability of the first physical programming unit is not less than the threshold, the memory management circuit 1102 determines that the reliability of the first physical programming unit belongs to the second type reliability. Alternatively, in an exemplary embodiment, as similar to the operation in which the reliability of one physical programming unit is used to distinguish whether that physical programming unit belongs to the first type physical programming unit or the second type physical programming unit, if one physical programming unit is identified as the first type physical programming unit, the reliability of that physical programming unit belongs to the first type reliability; and if one physical programming unit is identified as the second type physical programming unit, the reliability of that physical programming unit belongs to the second type reliability.

If the reliability of the first physical programming unit belongs to the first type reliability, the memory management circuit 1102 may generate a primary verification code (also known as a first primary verification code) corresponding to the first data, and the first primary verification code has a first length. If the reliability of the first physical programming unit belongs to the second type reliability, the memory management circuit 1102 may generate another primary verification code (also known as a second primary verification code) corresponding to the first data. The second primary verification code has a second length, and the first length is longer than the second length. In other words, if the reliability of one physical programming unit is lower, the data length of the primary verification code for protecting the data in that physical programming unit is longer.

In an exemplary embodiment, if the reliability of the first physical programming unit belongs to the first type reliability, the memory management circuit 1102 further generates a secondary verification code corresponding to the first data. The secondary verification code is configured to be combined with the first primary verification code, provide decoding information, or to be used in a pre-decoding procedure. For example, a method of combining the secondary verification code with the first primary verification code is identical or similar to the method of combining the verification code 1421 with the verification code 1422 in the exemplary embodiment of FIG. 14. Among them, the verification code 1421 may be regarded as the first primary verification code, and the verification code 1422 may be regarded as the secondary verification code. For example, the decoding information provided by the secondary verification code may be any information for improving a decoding capability of the first primary verification code or for assisting the first primary verification code to decode. For example, the first primary verification code and the secondary verification code may be used to verify different parts of the first data, respectively. In addition, for example, a method of using the secondary verification code in the pre-decoding procedure includes the following. Before decoding one specific data by using the first primary verification code, a part of errors in the specific data is located by using the secondary verification code. Later, after the located errors are marked or corrected, the rest of the errors in the specific data can be located by using the first primary verification code. Accordingly, a capability of first primary verification code for detecting errors may be improved. Nonetheless, any methods capable of assisting the first primary verification code for verifying data or correcting errors by using the secondary verification code may be applied in the invention, which are not particularly limited in the invention.

In an exemplary embodiment, the new verification code obtained by combining the first primary verification code and the secondary verification code is corresponding to a preset generation matrix G, and the first primary verification code is corresponding to a sub-matrix of this preset generation matrix G. The sub-matrix is composed of parts of columns and rows of the preset generation matrix G. In addition, in an exemplary embodiment, the memory management circuit 1102 may obtain a designed generation matrix and generate a preset verification code according to said generation matrix, and the first primary verification code is included in the preset verification code. The memory management circuit 1102 may generate the secondary verification code according to the preset verification code and the first primary verification code. For example, the memory management circuit 1102 may use a part of all of codes in the preset verification code excluding the first primary verification code as the secondary verification code. In addition, the first primary verification code and/or the corresponding secondary verification code may be generated by using any designed algorithms, which are not particularly limited in the invention. In addition, methods for using and generating the first primary verification code and the secondary verification code may also apply or combine uses of various foregoing exemplary embodiments.

It should be noted that, in above exemplary embodiments, the error checking and correcting circuit 1108 is controlled or instructed by the memory management circuit 1102, such that some operations (e.g., generating verification codes and combining verification codes into a new verification code) may be referred as being performed by the memory management circuit 1102 for explaining convenience.

Figure 17:
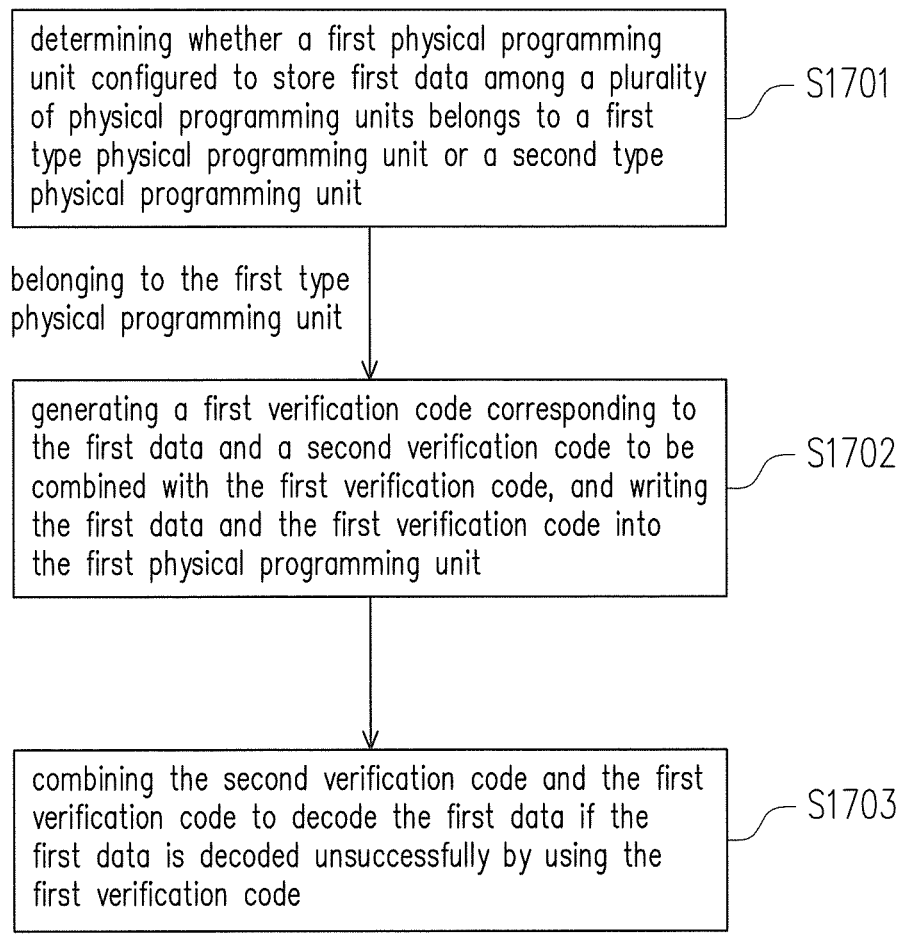
FIG. 17 is a flowchart illustrating a data accessing method according to an exemplary embodiment of the invention.

FIG. 17 is a flowchart illustrating a data accessing method according to an exemplary embodiment of the invention.

Referring to FIG. 17, in step S1701, whether a first physical programming unit configured to store first data among the physical programming units belongs to a first type physical programming unit or a second type physical programming unit is determined. If the first physical programming unit belongs to the first type physical programming unit, in step S1702, a first verification code corresponding to the first data and a second verification code for being combined with the first verification code are generated, and the first data and the first verification code are written into the first physical programming unit. In step S1703, the second verification code and the first verification code are combined to decode the first data if the first data is decoded unsuccessfully by using the first verification code.

Figure 18:
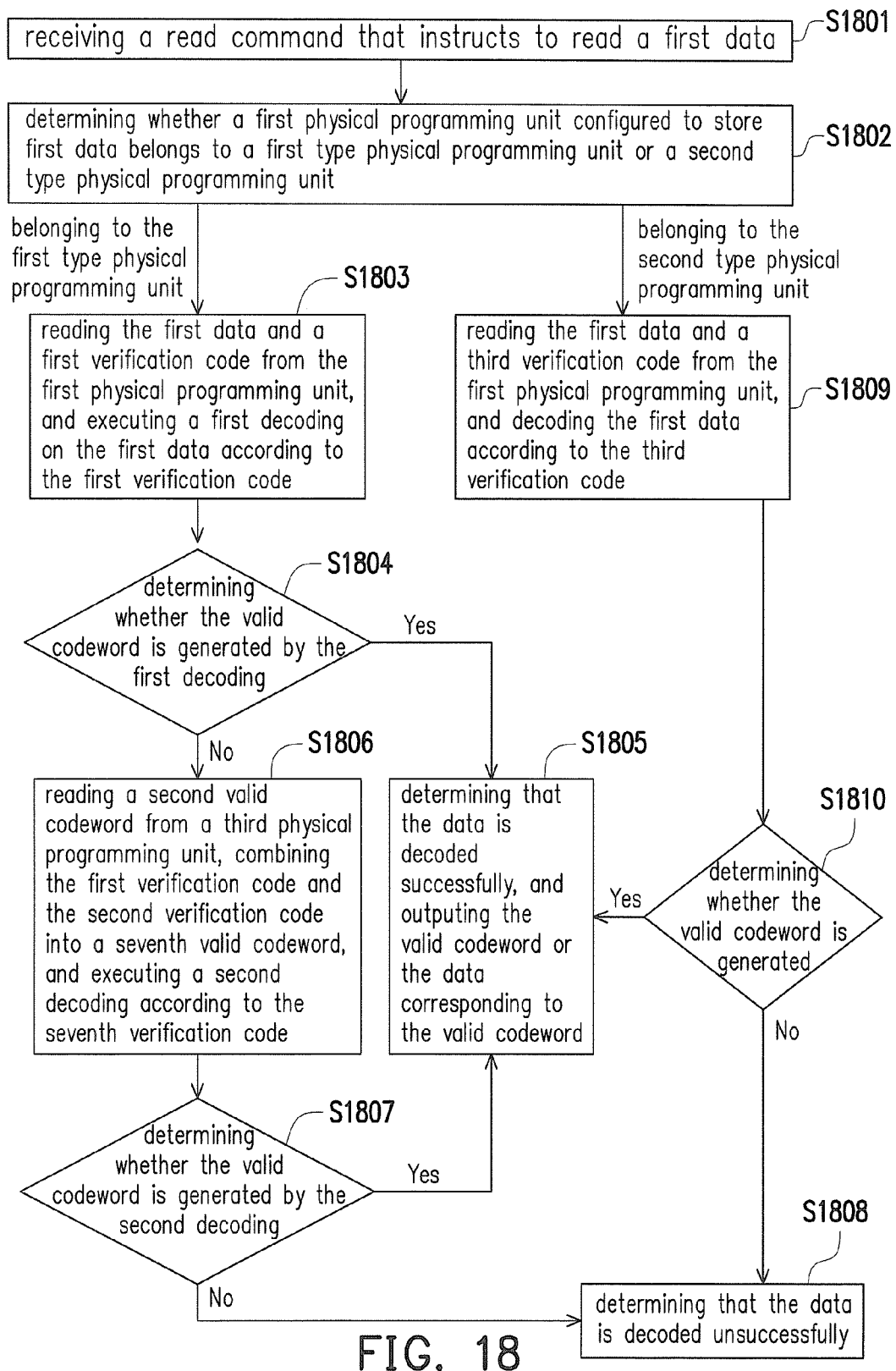
FIG. 18 is a flowchart illustrating a data accessing method according to another exemplary embodiment of the invention.

FIG. 18 is a flowchart illustrating a data accessing method according to another exemplary embodiment of the invention.

Referring to FIG. 18, in step S1801, a read command that instructs to read first data is received. In step S1802, whether a first physical programming unit configured to store first data belongs to a first type physical programming unit or a second type physical programming unit is determined. If the first physical programming unit belongs to the first type physical programming unit, in step S1803, the first data and a first verification code are read from the first physical programming unit, and a first decoding is executed on the first data according to the first verification code. In step S1804, whether a valid codeword is generated by the first decoding is determined. If the valid codeword is generated by the first decoding, in step S1805, it is determined that the data is decoded successfully, and the valid codeword or the data corresponding to the valid codeword are outputted. If the valid codeword is not generated by the first decoding, in step S1806, a second verification code is read from a third physical programming unit, the first verification code and the second verification code are combined into a seventh valid codeword, and a second decoding is executed according to the seventh verification code. In step S1807, whether a valid codeword is generated by the second decoding is determined. If the valid codeword is generated by the second decoding, proceeding to execute step S1805. If the valid codeword is not generated by the second decoding, in step S1808, it is determined that the data is decoded unsuccessfully. In addition, if the first physical programming unit belongs to the second type physical programming unit, in step S1809, the first data and a third verification code are read from the first physical programming unit, and the first data is decoded according to the third verification code. In step S1810, whether a valid codeword is generated is determined. If the valid codeword is generated, proceeding to execute step S1805. If the valid codeword is not generated, proceeding to execute step S1808. After it is determined that the decoding fails, a new read voltage may be used to re-read the first data, the soft bit mode decoding procedure may be used, or a failure message may be sent, which are not particularly limited in the invention.

Nevertheless, each of steps depicted in FIG. 17 and FIG. 18 have been described in detail as above, thus related description thereof is not repeated hereinafter. It should be noted that, the steps depicted in FIG. 17 and FIG. 18 may be implemented as a plurality of program codes or circuits, and the invention is not limited thereto. Moreover, the methods disclosed in FIG. 17 and FIG. 18 may be implemented with reference to above embodiments, or may be implemented separately, and the invention is not limited thereto.

In summary, with respect to data storage, the invention is capable of providing parts of storage spaces in the physical programming unit with higher reliability to store a part of the verification codes for protecting the data stored in the physical programming unit with lower reliability, such that the data length of the verification code for protecting the data stored in the physical programming unit with lower reliability may be increased. In addition, while reading data from the physical programming unit with lower reliability, the invention is capable of decoding the data by using the verification code with the preset data length, and increasing the data length of the verification code if the data is decoded unsuccessfully in order to execute another decoding by using the verification code with longer data length. Accordingly, a usage efficiency for the physical programming units with different reliabilities may be improved, and an operating life of the rewritable non-volatile memory module may also be effectively extended.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data accessing method for a rewritable non-volatile memory module, wherein the rewritable non-volatile memory module comprises a plurality of physical erasing units, wherein each of the physical erasing units comprises a plurality of physical programming units, and the data accessing method comprises:
   determining whether a first physical programming unit configured to store first data among the physical programming units belongs to a first type physical programming unit or a second type physical programming unit;
   if the first physical programming unit belongs to the first type physical programming unit, generating a first verification code corresponding to the first data and a second verification code for being combined with the first verification code, and writing the first data and the first verification code into the first physical programming unit; and
   combining the second verification code and the first verification code to decode the first data if the first data is decoded unsuccessfully by using the first verification code.

2. The data accessing method of claim 1, further comprising:
   if the first physical programming unit belongs to the second type physical programming unit, generating a third verification code corresponding to the first data, and writing the first data, the third verification code and a fourth verification code for being combined with a fifth verification code into the first physical programming unit,
   wherein the fifth verification code is configured to verify second data, the second data and the fifth verification code are stored in a second physical programming unit belonging to the first type physical programming unit among the physical programming units, and a data length of the third verification code is shorter than the data length of the first verification code.

3. The data accessing method of claim 2, further comprising:
  combining the fourth verification code and the fifth verification code to decode the second data if the second data is decoded unsuccessfully by using the fifth verification code.

4. The data accessing method of claim 3, wherein the step of combining the fourth verification code and the fifth verification code to decode the second data if the second data is decoded unsuccessfully by using the fifth verification code comprises:
  reading the second data and the fifth verification code from the second physical programming unit according to a read command;
  executing a first decoding on the second data according to the fifth verification code, and determining whether a valid codeword is generated by the first decoding; and
  if the valid codeword is not generated by the first decoding, reading the fourth verification code from the first physical programming unit, combining the fourth verification code and the fifth verification code into a sixth verification code, and executing a second decoding on the second data according to the sixth verification code.

5. The data accessing method of claim 2, wherein the data length of the fifth verification code is equal to a total of the data length of the third verification code and the data length of the fourth verification code.

6. The data accessing method of claim 1, further comprising:
  writing the second verification code into a third physical programming unit belonging to the second type physical programming unit among the physical programming units.

7. The data accessing method of claim 1, wherein the step of combining the second verification code and the first verification code to decode the first data if the first data is decoded unsuccessfully by using the first verification code comprises:
  reading the first data and the first verification code from the first physical programming unit according to a read command;
  executing a first decoding on the first data according to the first verification code, and determining whether a valid codeword is generated by the first decoding; and
  if the valid codeword is not generated by the first decoding, reading the second verification code, combining the first verification code and the second verification code into a seventh verification code, and executing a second decoding on the first data according to the seventh verification code.

8. The data accessing method of claim 1, wherein the first type physical programming unit is an upper physical programming unit, and the second type physical programming unit is a lower physical programming unit.

9. The data accessing method of claim 1, wherein if the first physical programming unit belongs to the first type physical programming unit, the data accessing method further comprises:
  combining the first verification code and the second verification code in order to obtain a seventh verification code composed of a N number of bits, wherein the first verification code is composed of a first to a $M^{th}$ bits among the N number of bits, and the second verification code is composed of a $(M+1)^{th}$ to a $N^{th}$ bits among the N number of bits.

10. The data accessing method of claim 1, wherein the data accessing method encodes and decodes by using a low density parity code algorithm.

11. A memory controlling circuit unit for controlling a rewritable non-volatile memory module, wherein the rewritable non-volatile memory module comprises a plurality of physical erasing units, wherein each of the physical erasing units comprises a plurality of physical programming units, and the memory controlling circuit unit comprises:
  a host interface, configured to couple to a host system;
  a memory interface, configured to couple to the rewritable non-volatile memory module;
  a memory management circuit, coupled to the host interface and the memory interface and configured to send a read command sequence in order to read data from the rewritable non-volatile memory module or send a write command sequence in order to write data into the rewritable non-volatile memory module; and
  an error checking and correcting circuit, coupled to the memory management circuit,
  wherein the memory management circuit is configured to determine whether a first physical programming unit configured to store first data among the physical programming units belongs to a first type physical programming unit or a second type physical programming unit,
  wherein if the first physical programming unit belongs to the first type physical programming unit, the memory management circuit is further configured to instruct the error checking and correcting circuit to generate a first verification code corresponding to the first data and a second verification code for being combined with the first verification code,
  wherein the memory management circuit is further configured to send the write command sequence in order to write the first data and the first verification code into the first physical programming unit,
  wherein the error checking and correcting circuit is configured to combine the second verification code and the first verification code to decode the first data if the first data is decoded unsuccessfully by using the first verification code.

12. The memory controlling circuit unit of claim 11, wherein if the first physical programming unit belongs to the second type physical programming unit, the memory management circuit is further configured to instruct the error checking and correcting circuit to generate a third verification code corresponding to the first data,
  wherein the memory management circuit is further configured to send the write command sequence in order to write the first data, the third verification code and a fourth verification code for being combined with a fifth verification code into the first physical programming unit,
  wherein the fifth verification code is configured to verify second data, the second data and the fifth verification code are stored in a second physical programming unit belonging to the first type physical programming unit among the physical programming units, and a data length of the third verification code is shorter than the data length of the first verification code.

13. The memory controlling circuit unit of claim 12, wherein the error checking and correcting circuit is further configured to combine the fourth verification code and the fifth verification code to decode the second data if the second data is decoded unsuccessfully by using the fifth verification code.

14. The memory controlling circuit unit of claim 13, wherein the operation of the error checking and correcting circuit combining the fourth verification code and the fifth verification code to decode the second data if the second data is decoded unsuccessfully by using the fifth verification code comprises:

the memory management circuit sends the read command sequence in order to read the second data and the fifth verification code from the second physical programming unit according to a read command;

the error checking and correcting circuit executes a first decoding on the second data according to the fifth verification code, and the memory management circuit determines whether a valid codeword is generated by the first decoding; and if the valid codeword is not generated by the first decoding, the memory management circuit sends the read command sequence in order to read the fourth verification code from the first physical programming unit, and the error checking and correcting circuit combines the fourth verification code and the fifth verification code into a sixth verification code and executes a second decoding on the second data according to the sixth verification code.

15. The memory controlling circuit unit of claim 12, wherein the data length of the fifth verification code is equal to a total of the data length of the third verification code and the data length of the fourth verification code.

16. The memory controlling circuit unit of claim 11, wherein the memory management circuit is further configured to send the write command sequence in order to write the second verification code into a third physical programming unit belonging to the second type physical programming unit among the physical programming units.

17. The memory controlling circuit unit of claim 11, wherein the operation of the error checking and correcting circuit combining the second verification code and the first verification code to decode the first data if the first data is decoded unsuccessfully by using the first verification code comprises:

the memory management circuit sends the read command sequence in order to read the first data and the first verification code from the first physical programming unit according to a read command;

the error checking and correcting circuit executes a first decoding on the first data according to the first verification code, and the memory management circuit determines whether a valid codeword is generated by the first decoding; and if the valid codeword is not generated by the first decoding, the memory management circuit sends the read command sequence in order to read the second verification code, and the error checking and correcting circuit combines the first verification code and the second verification code into a seventh verification code and executes a second decoding on the first data according to the seventh verification code.

18. The memory controlling circuit unit of claim 11, wherein the first type physical programming unit is an upper physical programming unit, and the second type physical programming unit is a lower physical programming unit.

19. The memory controlling circuit unit of claim 11, wherein if the first physical programming unit belongs to the second type physical programming unit, the memory management circuit is further configured to combine the first verification code and the second verification code in order to obtain a seventh verification code composed of a N number of bits, wherein the first verification code is composed of a first to a $M^{th}$ bits among the N number of bits, and the second verification code is composed of a $(M+1)^{th}$ to a $N^{th}$ bits among the N number of bits.

20. The memory controlling circuit unit of claim 11, wherein the error checking and correcting circuit encodes and decodes by using a low density parity code algorithm.

21. A memory storage device, comprising:

a connection interface unit, configured to couple to a host system;

a rewritable non-volatile memory module, comprising a plurality of physical erasing units, wherein each of the physical erasing units comprises a plurality of physical programming units;

a memory controlling circuit unit, coupled to the connection interface unit and the rewritable non-volatile memory module, wherein the memory controlling circuit unit is configured to determine whether a first physical programming unit configured to store first data among the physical programming units belongs to a first type physical programming unit or a second type physical programming unit, wherein if the first physical programming unit belongs to the first type physical programming unit, the memory controlling circuit unit is further configured to generate a first verification code corresponding to the first data and a second verification code for being combined with the first verification code and write the first data and the first verification code into the first physical programming unit, wherein the memory controlling circuit unit is further configured to combine the second verification code and the first verification code to decode the first data if the first data is decoded unsuccessfully by using the first verification code.

22. The memory storage device of claim 21, further comprising:

if the first physical programming unit belongs to the second type physical programming unit, the memory controlling circuit unit is further configured to generate a third verification code corresponding to the first data and write the first data, the third verification code and a fourth verification code for being combined with a fifth verification code into the first physical programming unit, wherein the fifth verification code is configured to verify second data, the second data and the fifth verification code are stored in a second physical programming unit belonging to the first type physical programming unit among the physical programming units, and a data length of the third verification code is shorter than the data length of the first verification code.

23. The memory storage device of claim 22, wherein the memory controlling circuit unit is further configured to combine the fourth verification code and the fifth verification code to decode the second data if the second data is decoded unsuccessfully by using the fifth verification code.

24. The memory storage device of claim 23, wherein the operation of the memory controlling circuit unit combining the fourth verification code and the fifth verification code to decode the second data if the second data is decoded unsuccessfully by using the fifth verification code comprises:

reading the second data and the fifth verification code from the second physical programming unit according to a read command;

executing a first decoding on the second data according to the fifth verification code, and determining whether a valid codeword is generated by the first decoding; and if the valid codeword is not generated by the first decoding, reading the fourth verification code from the first physical programming unit, combining the fourth verification code and the fifth verification code into a sixth verification code, and executing a second decoding on the second data according to the sixth verification code.

25. The memory storage device of claim 22, wherein the data length of the fifth verification code is equal to a total of the data length of the third verification code and the data length of the fourth verification code.

26. The memory storage device of claim 21, wherein the memory controlling circuit unit is further configured to write the second verification code into a third physical programming unit belonging to the second type physical programming unit among the physical programming units.

27. The memory storage device of claim 21, wherein the operation of the memory controlling circuit unit combining the second verification code and the first verification code to decode the first data if the first data is decoded unsuccessfully by using the first verification code comprises:

reading the first data and the first verification code from the first physical programming unit according to a read command;

executing a first decoding on the first data according to the first verification code, and determining whether a valid codeword is generated by the first decoding; and if the valid codeword is not generated by the first decoding, reading the second verification code, combining the first verification code and the second verification code into a seventh verification code, and executing a second decoding on the first data according to the seventh verification code.

28. The memory storage device of claim 21, wherein the first type physical programming unit is an upper physical programming unit, and the second type physical programming unit is a lower physical programming unit.

29. The memory storage device of claim 21, wherein if the first physical programming unit belongs to the first type physical programming unit, the memory controlling circuit unit is further configured to combine the first verification code and the second verification code in order to obtain a seventh verification code composed of a N number of bits, wherein the first verification code is composed of a first to a $M^{th}$ bits among the N number of bits, and the second verification code is composed of a $(M+1)^{th}$ to a $N^{th}$ bits among the N number of bits.

30. The memory storage device of claim 21, wherein the memory controlling circuit unit encodes and decodes by using a low density parity code algorithm.

31. A memory storage device, comprising:

a connection interface unit, configured to couple to a host system;

a rewritable non-volatile memory module, comprising a plurality of physical erasing units, wherein each of the physical erasing units comprises a plurality of physical programming units;

a memory controlling circuit unit, coupled to the connection interface unit and the rewritable non-volatile memory module, wherein the memory controlling circuit unit is configured to determine whether a reliability of a first physical programming unit configured to store first data among the physical programming units belongs to a first type reliability or a second type reliability, if the reliability of the first physical programming unit belongs to the first type reliability, the memory controlling circuit unit is further configured to generate a first primary verification code corresponding to the first data and a secondary verification code corresponding to the first data, wherein the first primary verification code has a first length, and the secondary verification code is configured to be combined with the first primary verification code, provide decoding information, or to be used in a pre-decoding procedure, if the reliability of the first physical programming unit belongs to the second type reliability, the memory controlling circuit unit is further configured to generate a second primary verification code corresponding to the first data, wherein the second primary verification code has a second length, and the first length is longer than the second length.

32. The memory storage device of claim 31, wherein the operation of the memory controlling circuit unit generating the secondary verification code corresponding to the first data comprises:

obtaining a generation matrix and generating a preset verification code according to the generation matrix, wherein the first primary verification code is included in the preset verification code; and generating the secondary verification code according to the preset verification code and the first primary verification code.

33. The memory storage device of claim 31, wherein the second type reliability is higher than the first type reliability.

* * * * *